United States Patent
MacManus

(10) Patent No.: US 12,267,987 B2
(45) Date of Patent: Apr. 1, 2025

(54) SELF-COOLING CHASSIS FOR A COMMUNICATIONS DEVICE

(71) Applicant: Rakuten Symphony, Inc., Tokyo (JP)

(72) Inventor: Gerard MacManus, Tewsbury, MA (US)

(73) Assignee: RAKUTEN SYMPHONY, INC., Tokyo (JP)

( * ) Notice: Subject to any disclaimer, the term of this patent is extended or adjusted under 35 U.S.C. 154(b) by 0 days.

(21) Appl. No.: 17/782,056

(22) PCT Filed: May 27, 2022

(86) PCT No.: PCT/US2022/031344
§ 371 (c)(1),
(2) Date: Jun. 2, 2022

(87) PCT Pub. No.: WO2023/229606
PCT Pub. Date: Nov. 30, 2023

(65) Prior Publication Data
US 2024/0164061 A1  May 16, 2024

(51) Int. Cl.
*H05K 7/20* (2006.01)
*F16M 13/02* (2006.01)
*H04W 88/08* (2009.01)

(52) U.S. Cl.
CPC ......... *H05K 7/20409* (2013.01); *F16M 13/02* (2013.01); *H05K 7/2029* (2013.01); *H04W 88/085* (2013.01)

(58) Field of Classification Search
CPC .. H05K 7/20409; H05K 7/2029; F16M 13/02; H04W 88/085
See application file for complete search history.

(56) References Cited

U.S. PATENT DOCUMENTS 5,883,787 A   3/1999   Reier
5,986,618 A   11/1999  Aakula et al.
(Continued)

OTHER PUBLICATIONS

International Search Report and Written Opinion for Intl. Pat. App. No. PCT/US22/31344 mailed Oct. 26, 2022.
(Continued)

*Primary Examiner* — Anthony M Haughton
*Assistant Examiner* — Hung Q Dang
(74) *Attorney, Agent, or Firm* — Sughrue Mion, PLLC

(57) ABSTRACT

A self-cooling chassis for a communication device. The chassis includes a top housing including a first set of input/output (I/O) connectors arranged along a top housing front side. The top housing is configured to house at least one processor communicatively coupled to the first set of I/O connectors. The top housing has a top side including a plurality of heat fins configured to dissipate heat away from the at least one processor. The top housing has a top housing aperture. The chassis includes a bottom housing including a second set of I/O connectors arranged along a bottom housing front side. The bottom housing houses a I/O circuitry. The I/O circuitry communicatively couples the second set of I/O connectors to at least one processor. The bottom housing has a bottom housing aperture. The chassis includes a guide pin configured to be inserted into a top housing aperture and a bottom housing aperture. The top housing and the bottom housing are configured to connect by aligning the top housing front side with the bottom housing front side and by aligning the guide pin into the top housing aperture and the bottom housing aperture.

21 Claims, 29 Drawing Sheets

(56) References Cited

U.S. PATENT DOCUMENTS

| | | | |
|---|---|---|---|
| 7,031,158 B2* | 4/2006 | Leon | H05K 7/20336 |
| | | | 174/15.1 |
| 2016/0173672 A1 | 6/2016 | Boyce | |
| 2018/0284373 A1 | 10/2018 | Lin et al. | |
| 2021/0404748 A1* | 12/2021 | Bassett | F25D 11/00 |

OTHER PUBLICATIONS

Altiostar, "Rakuten Symphony, Intel and Juniper Networks introduce next generation distributed RAN and transport solution to further simplify Open RAN deployments at scale," Oct. 26, 2021 <https://www.altiostar.com/rakuten-symphony-intel-and-juniper-networks-introduce-next-generation-distributed-ran-and-transport-solution-to-further-simplify-open-ran-deployments-at-scale/>.

* cited by examiner

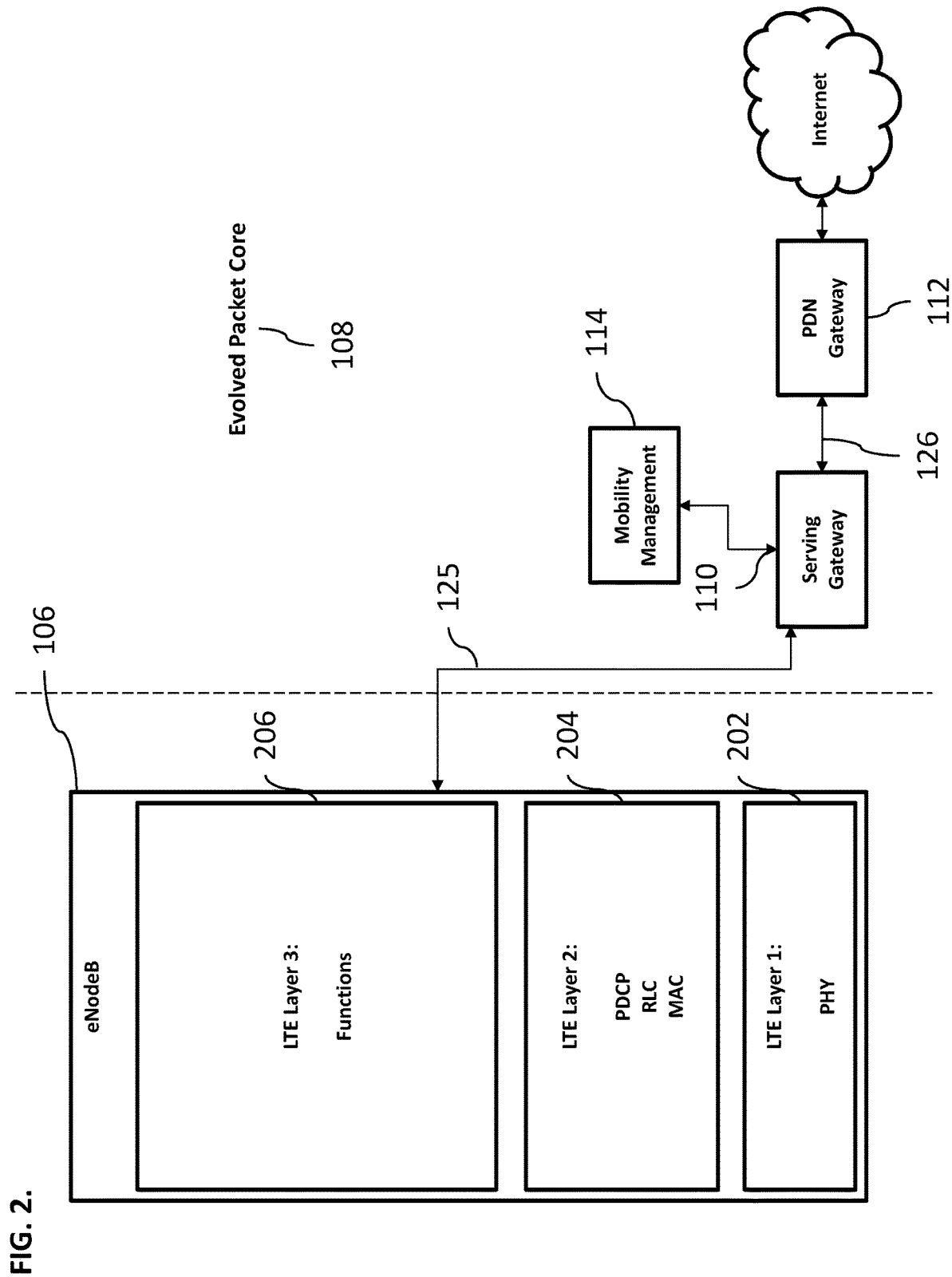

SELF-COOLING CHASSIS FOR A COMMUNICATIONS DEVICE

CROSS-REFERENCE TO RELATED APPLICATIONS

The present application claims priority to and is the 35 U.S.C. 371 United States National Phase application based on International Patent Application No. PCT/US2022/031344, filed on May 27, 2022, entitled "Self-Cooling Chassis for a Communications Device," and incorporates its disclosure herein by reference in its entirety.

TECHNICAL FIELD

In some implementations, the current subject matter relates to telecommunications systems, and in particular, to self-cooling chassis for radio communications devices in a wireless communication system.

BACKGROUND

In today's world, cellular networks provide on-demand communications capabilities to individuals and business entities. Typically, a cellular network is a wireless network that can be distributed over land areas, which are called cells. Each such cell is served by at least one fixed-location transceiver, which is referred to as a cell site or a base station. Each cell can use a different set of frequencies than its neighbor cells in order to avoid interference and provide improved service within each cell. When cells are joined together, they provide radio coverage over a wide geographic area, which enables a large number of mobile telephones, and/or other wireless devices or portable transceivers to communicate with each other and with fixed transceivers and telephones anywhere in the network. Such communications are performed through base stations and are accomplished even if the mobile transceivers are moving through more than one cell during transmission. Major wireless communications providers have deployed such cell sites throughout the world, thereby allowing communications mobile phones and mobile computing devices to be connected to the public switched telephone network and public Internet.

A mobile telephone is a portable telephone that is capable of receiving and/or making telephone and/or data calls through a cell site or a transmitting tower by using radio waves to transfer signals to and from the mobile telephone. In view of a large number of mobile telephone users, current mobile telephone networks provide a limited and shared resource. In that regard, cell sites and handsets can change frequency and use low power transmitters to allow simultaneous usage of the networks by many callers with less interference. Coverage by a cell site can depend on a particular geographical location and/or a number of users that can potentially use the network. For example, in a city, a cell site can have a range of up to approximately ½ mile; in rural areas, the range can be as much as 5 miles; and in some areas, a user can receive signals from a cell site 25 miles away.

The following are examples of some of the digital cellular technologies that are in use by the communications providers: Global System for Mobile Communications ("GSM"), General Packet Radio Service ("GPRS"), cdmaOne, CDMA2000, Evolution-Data Optimized ("EV-DO"), Enhanced Data Rates for GSM Evolution ("EDGE"), Universal Mobile Telecommunications System ("UMTS"), Digital Enhanced Cordless Telecommunications ("DECT"), Digital AMPS ("IS-136/TDMA"), and Integrated Digital Enhanced Network ("iDEN"). The Long Term Evolution, or 4G LTE, which was developed by the Third Generation Partnership Project ("3GPP") standards body, is a standard for a wireless communication of high-speed data for mobile phones and data terminals. A 5G standard is currently being developed and deployed. 3GPP cellular technologies like LTE and 5G NR are evolutions of earlier generation 3GPP technologies like the GSM/EDGE and UMTS/HSPA digital cellular technologies and allows for increasing capacity and speed by using a different radio interface together with core network improvements.

Cellular networks can be divided into radio access networks and core networks. The radio access network (RAN) can include network functions that can handle radio layer communications processing. The core network can include network functions that can handle higher layer communications, e.g., internet protocol (IP), transport layer and applications layer. In some cases, the RAN functions can be split into baseband unit functions and the radio unit functions, where a radio unit connected to a baseband unit via a fronthaul network, for example, can be responsible for lower layer processing of a radio physical layer while a baseband unit can be responsible for the higher layer radio protocols, e.g., MAC, RLC, etc.

Currently, distributed units are positioned inside a temperature-regulated cabinet for regulating temperature of the distributed units. Temperature-regulated cabinets require advanced electrical and mechanical features to optimize cooling of processors inside the distributed units. Temperature-regulating cabinets typically include air conditioners and air-circulating units positioned for maintaining the distributed units under threshold temperatures. Additionally, temperature-regulating cabinets limit locations and positions in which distributed units may be situated. That is, physical and weight constraints of the temperature-regulating cabinets prohibit distributed units from being mounted in some locations. Further, temperature-regulating cabinets consume large amounts of energy to maintain a cool environment for the distributed units. Large energy demands only increase as the ambient temperature increases or as more distributed units are added to the temperature-regulating cabinets.

SUMMARY

In some implementations, the current subject matter relates to an apparatus, such as, for example, a self-cooling chassis for a communication device. The apparatus may include a top housing including a first set of input/output (I/O) connectors arranged along a top housing front side. The top housing may be configured to house at least one processor communicatively coupled to the first set of I/O connectors. The top housing may have a top side including a plurality of heat fins configured to dissipate heat away from the at least one processor. The top housing may have a top housing aperture. The apparatus may also include a bottom housing including a second set of I/O connectors arranged along a bottom housing front side. The bottom housing may be configured to house a I/O circuitry. The I/O circuitry may be configured to communicatively couple the second set of I/O connectors to the at least one processor. The bottom housing may have a bottom housing aperture. The apparatus may also include a guide pin configured to be inserted into a top housing aperture and a bottom housing aperture. The top housing and the bottom housing may be configured to connect by aligning the top housing front side with the bottom housing front side and by aligning the guide pin into the top housing aperture and the bottom housing aperture.

In some implementations, the current subject matter may include one or more of the following optional features. The plurality of heat fins may extend in a first direction across the top side of the top housing. The top housing front side may extends in a second direction perpendicular to the first direction.

In some implementations, the plurality of heat fins may include one or more two-phased heat fins and wherein the plurality of heat fins are configured to have a predetermined pitch extending along the top side.

In some implementations, the first set of I/O connectors may be arranged in a linear pattern across the top housing front side, where the second set of I/O connectors may be arranged in the linear pattern across the bottom housing front side, and wherein the first set of I/O connectors and the second set of I/O connectors may be radio signal access connectors.

In some implementations, the apparatus may also include a solar shield configured to cover the plurality of heat fins on the top housing for mitigating solar radiation absorbed by the plurality of heat fins, the solar shield including a plurality of ventilation slots for allowing heat dissipation from the plurality of heat fins.

In some implementations, the apparatus may also include a lip coupled to at least one of the top housing or the bottom housing, the lip configured to detachably couple to a mounting bar by sliding the lip over an edge of the mounting bar, and a handle coupled to at least one of the top housing or the bottom housing, the handle positioned on the opposite side of at least one of the top housing or the bottom housing for detaching the lip from the mounting bar.

In some implementations, the top housing and the bottom housing may be configured to fasten and align together an alignment fastener coupled to the at least one of the top housing or the bottom housing, where the alignment fastener may be configured to control a final linear alignment of the top housing and the bottom housing.

In some implementations, the apparatus may also include an embedded vapor chamber coupled to the top housing, the embedded vapor chamber configured to spread heat away from the processor, and an O-ring detachably coupled to at least one of the top housing and the bottom housing, the O-ring configured to create a seal between the top housing and the bottom housing, the seal being IP-65 compliant.

In some implementations, at least one of the at least one processor and the I/O circuitry may be included in a base station that includes at least one of: a gNodeB base station, an eNodeB base station, and any combination thereof. The base station may include at least one of: one or more distributed units, one or more baseband units, one or more radio interface units, one or more remote radio heads, and any combination thereof. The base station may be a base station operating in at least one of the following communications systems: a long term evolution communications system and a new radio communications system.

In some implementations, the current subject matter relates to a method for assembling an apparatus. The method may include providing a top housing and a bottom housing, the top housing including a first set of input/output (I/O) connectors arranged along a top housing front side, the top housing configured to house at least one processor communicatively coupled to the first set of I/O connectors, the top housing having a top side including a plurality of heat fins configured to dissipate heat away from the at least one processor, the top housing including a first aperture, the bottom housing including a second set of I/O connectors arranged along a bottom housing front side, the bottom housing configured to house an I/O circuitry, the I/O circuitry configured to communicatively couple the second set of I/O connectors to the processor, the bottom housing including a second aperture. The method may also include aligning the first aperture of the top housing with the second aperture of the bottom housing using a guide pin, the aligning of the top housing with the bottom housing includes aligning the top housing front side with the bottom housing front side and aligning of the top housing alignment fastener with the bottom housing alignment aperture. The method may further include controlling a linear alignment of the top housing and the bottom housing through connection of the top housing alignment fastener and the bottom housing alignment aperture.

In some implementations, the current subject matter may also include one or more of the following optional features. An embedded vapor chamber may be coupled to the top housing, the embedded vapor chamber configured to spread heat away from the processor. A solar shield, configured to cover the plurality of heat fins, may be coupled to the top housing for mitigating solar radiation absorbed by the plurality of heat fins, the solar shield including a plurality of ventilation slots for allowing heat dissipation from the plurality of heat fins.

In some implementations, the plurality of heat fins may extend in a first direction across the top side of the top housing, and wherein the top housing front side extends in a second direction perpendicular to the first direction.

In some implementations, the plurality of heat fins may include two-phased heat fins and wherein the plurality of heat fins are configured to have a predetermined pitch extending along the top side.

In some implementations, the first set of I/O connectors may be arranged in a linear pattern across the top housing front side, wherein the second set of I/O connectors are arranged in the linear pattern across the bottom housing front side, and wherein the first set of I/O connectors and the second set of I/O connectors are radio signal access connectors.

In some implementations, an O-ring may be coupled to at least one of the top housing and the bottom housing, the O-ring configured to create a seal between the top housing and the bottom housing.

In some implementations, a lip may be coupled to at least one of the top housing or the bottom housing, the lip configured to detachably couple to a mounting bar by sliding the lip over an edge of the mounting bar, and a handle may be coupled to at least one of the top housing or the bottom housing, the handle positioned on the opposite side of at least one of the top housing or the bottom housing for detaching the lip from the mounting bar.

In some implementations, the current subject matter relates to a mounting device for attaching a housing to a vertical column. The mounting device may include a housing bracket configured to couple to the housing, a first convex-shaped feature for receiving a proximate side of the vertical column, and the housing bracket including at least two housing bracket apertures; a distal bracket configured to couple to the housing bracket, a second convex-shaped feature for receiving a distal side of the vertical column, and the distal bracket including at least two distal bracket apertures; and at least two rods configured to couple the at least two housing bracket apertures and the at least two distal bracket apertures.

In some implementations, the current subject matter may include one or more of the following optional features. At least two rods may be threaded and wherein a threaded mechanism is applied to the at least two rods for moving the distal bracket closer to the housing bracket and wherein the convex-shaped feature is positioned between the at least two housing bracket apertures and wherein the second convex-shaped feature is positioned between the at least two distal bracket apertures.

In some implementations, the housing bracket may be configured to couple to another housing bracket such that the housing may be positioned alongside another housing.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

FIG. 1B illustrates further detail of the exemplary LTE system shown in FIG. 1a;

FIG. 1c illustrates additional detail of the evolved packet core of the exemplary LTE system shown in FIG. 1a;

FIG. 1d illustrates an exemplary evolved Node B of the exemplary LTE system shown in FIG. 1a;

FIG. 2 illustrates further detail of an evolved Node B shown in FIGS. 1a-d;

DETAILED DESCRIPTION

Figure 1A:
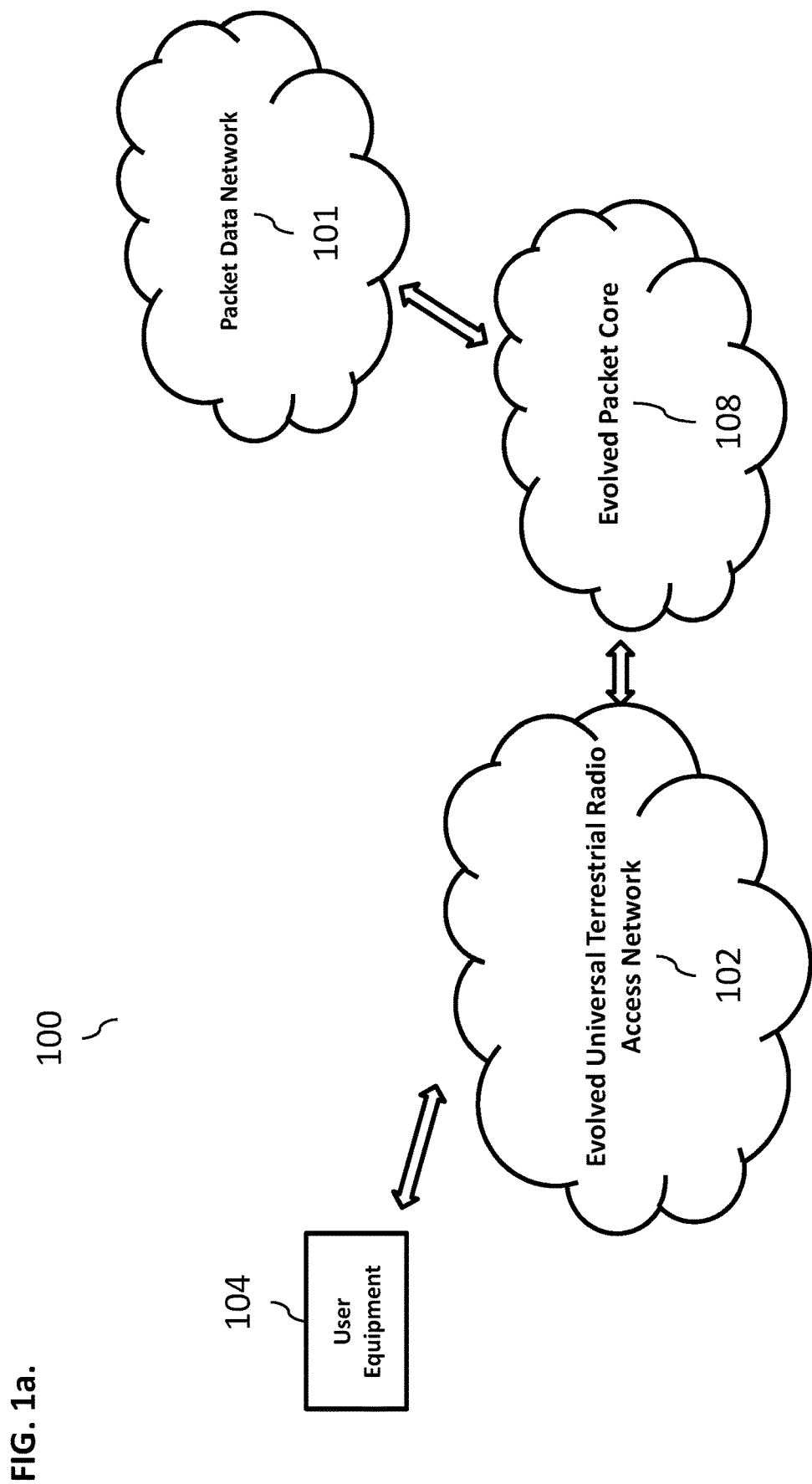
FIG. 1a illustrates an exemplary conventional long term evolution ("LTE") communications system.

The current subject matter can provide for systems and methods that can be implemented in wireless communications systems. Such systems can include various wireless communications systems, including 5G New Radio communications systems, long term evolution communication systems, etc.

In some implementations, the current subject matter relates to a self-cooling chassis for a communications unit or a device (e.g., a baseband unit, radio unit, a distributed unit, a remote unit, a centralized unit, and/or any other type of communications unit). The self-cooling chassis may include features and construction for dissipating heat from the communications device to prevent overheating. The communications device may easily overheat in view of demanding processing requirements required by higher layer radio protocols, (e.g., MAC, RLC, etc.). Unlike conventional casings for communications devices, the current subject matter's self-cooling chassis may eliminate the need for temperature-regulating cabinets and energy costs related to providing and/or regulating a temperate environment for the communications devices. Additionally, the current subject matter may relate to mounting brackets for mounting the self-cooling chassis. The mounting brackets may allow the self-cooling chassis to be mounted and/or suspended from various locations (e.g., poles, trees, mounting bars, etc.) that may have been previously inaccessible due to being contained within temperature-regulated cabinets.

The systems and apparatuses described herein solve technical problems associated with cooling distributed units in RAN. Currently, distributed units are positioned inside temperature-regulating cabinets for managing temperatures of distributed units' processors. Thus, if distributed units are not placed inside the temperature-regulating cabinets, processors will overheat and fail. Such failure may be detrimental to the functioning of RAN as distributed units process high-layer radio protocols and interface with radio units via fronthaul networks. As such, the temperature-regulating cabinets have been previously required for distributed units. Even then, temperature-regulating cabinets have their own problems. For example, temperature-regulating cabinets require advanced electrical and mechanical features (e.g., air conditioning units, air-circulating pathways and devices) to optimize the cooling of the processors inside the distributed units. Additionally, temperature-regulating cabinets consume high amounts of energy to maintain a cool environment for the distributed units. Energy demand only increases as the temperature increases and as more distributed units are added.

The systems and processes presented herein overcome these technical and challenges that exist in the industry. In some implementations, the self-cooling chassis may include a top housing and a bottom housing. The top housing may include processing circuitry with a processor that may be communicatively coupled to a set of input/output (I/O) connectors. The bottom housing may include input/output circuitry that may be configured to communicatively couple another set of I/O connectors to the processor. The separation of the processing circuitry and the I/O circuitry may enable improved heat dissipation away from the processor and away from the communications device. Additionally, the separation of the top housing and the bottom housing may enable improved heat dissipation. The top housing may also include a top side having a plurality of heat fins configured to dissipate heat away from the processor. The features and components of the self-cooling chassis may be arranged in a specific configuration for maintaining the processor and the I/O circuitry at a cool temperature without a need for a temperature-regulating cabinet.

The assembly technique of the top housing and the bottom housing may allow a final linear alignment of sensitive electronics and interfaces between the processing circuitry and the I/O circuitry. The top housing and the bottom housing may be configured to connect by aligning the top housing front side with the bottom housing front side. Further, a guide pin and an alignment fastener may be used to control alignment of the interfaces between the processing circuitry and the I/O circuitry.

In some implementations, the plurality of heat fins may extend in one direction across the top side of the top housing while the top housing front side extends in a perpendicular direction. In an upright position, the self-cooling chassis may allow a natural convection pathway through the self-cooling chassis. That is, when the self-cooling chassis is in an upright position, heated air near the bottom end of the plurality of heat fins may rise through an open pathway up towards to top end of the plurality of heat fins. This may allow heated air to exit through the top end of the plurality of heat fins and the cooler air to be naturally drawn in through the bottom end of the plurality of heat fins without the use of fans.

In some implementations, the self-cooling chassis may include a mounting bracket for optimizing the air flow through the plurality of heat fins. Existing distributed units cannot be mounted as free-standing units to trees or poles. But the self-cooling chassis untethers the distributed units from temperature-regulating cabinets. This may allow the self-cooling chassis to be mounted to a variety of locations. For example, the self-cooling chassis may mount to vertical columns, poles, racks, or trees that were previously inaccessible. The mounting bracket may couple to the self-cooling chassis at a skinny end or a length-wise end and minimize the interference with airflow at the self-cooling chassis.

Further, the self-cooling chassis may be positioned in different environments and locations, which is advantageous over previous systems that must be stored in temperature-regulating cabinets. With the self-cooling chassis, infrastructure development is no longer limited to environments conducive for temperature-regulating cabinets. Additionally, the self-cooling chassis may maintain the same performance as previous systems when processing high-layer radio protocols and interfacing with communications devices via fronthaul networks. Further, the energy consumption related to regulating the temperature of the self-cooling chassis is eliminated.

One or more aspects of the current subject matter can be incorporated into transmitter and/or receiver components of base stations (e.g., gNodeBs, eNodeBs, etc.) in such communications systems. The following is a general discussion of long-term evolution communications systems and 5G New Radio communication systems.

I. Long Term Evolution Communications System

FIGS. 1a-c and 2 illustrate an exemplary conventional long-term evolution ("LTE") communication system 100 along with its various components. An LTE system or a 4G LTE, as it is commercially known, is governed by a standard for wireless communication of high-speed data for mobile telephones and data terminals. The standard is an evolution of the GSM/EDGE ("Global System for Mobile Communications"/"Enhanced Data rates for GSM Evolution") as well as UMTS/HSPA ("Universal Mobile Telecommunications System"/"High Speed Packet Access") network technologies. The standard was developed by the 3GPP ("3rd Generation Partnership Project").

Figure 1B:
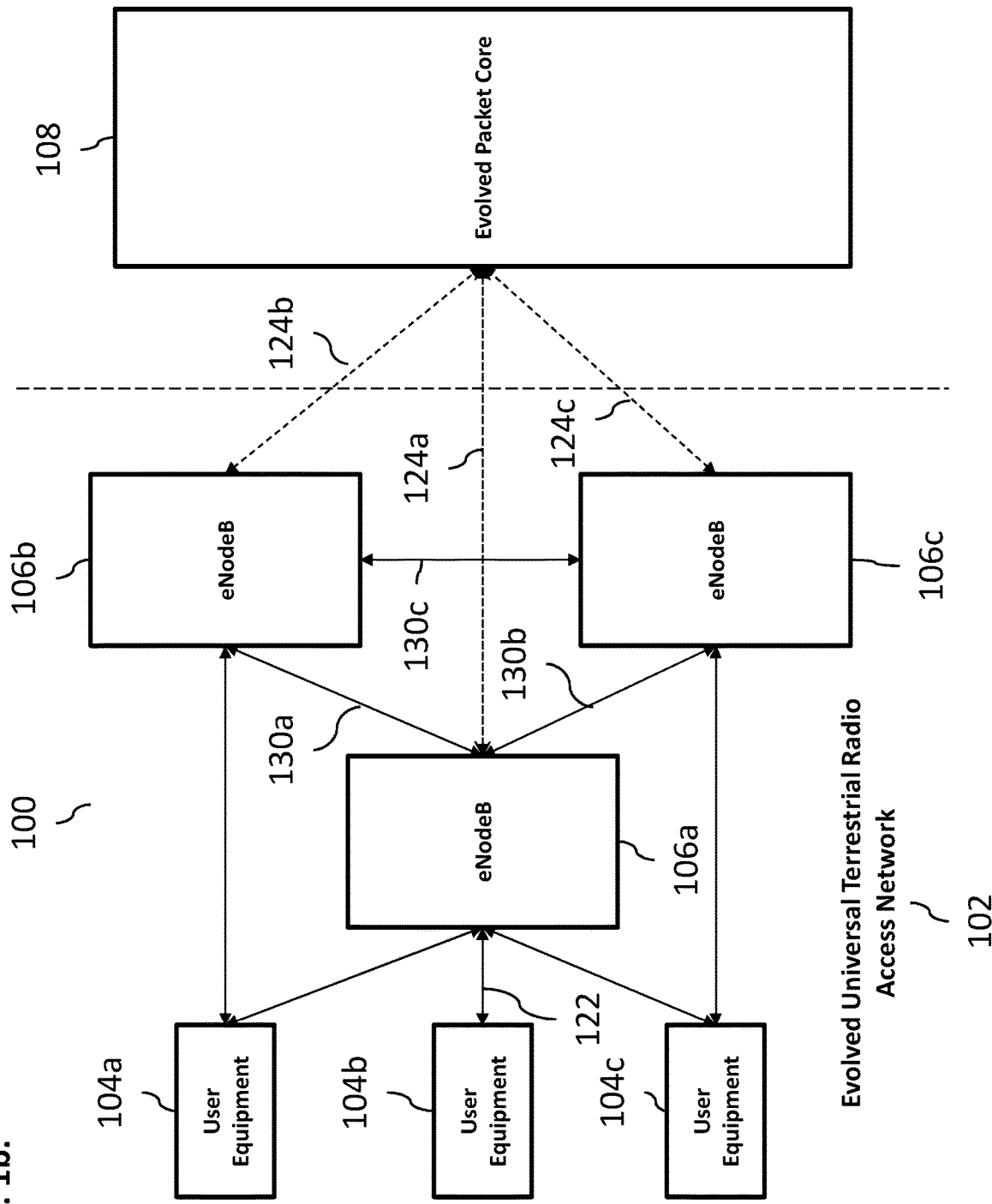

As shown in FIG. 1a, the system 100 can include an evolved universal terrestrial radio access network ("EUTRAN") 102, an evolved packet core ("EPC") 108, and a packet data network ("PDN") 101, where the EU IRAN 102 and EPC 108 provide communication between a user equipment 104 and the PDN 101. The EUTRAN 102 can include a plurality of evolved node B's ("eNodeB" or "ENODEB" or "enodeb" or "eNB") or base stations 106 (a, b, c) (as shown in FIG. 1B) that provide communication capabilities to a plurality of user equipment 104(a, b, c). The user equipment 104 can be a mobile telephone, a smartphone, a tablet, a personal computer, a personal digital assistant ("PDA"), a server, a data terminal, and/or any other type of user equipment, and/or any combination thereof. The user equipment 104 can connect to the EPC 108 and eventually, the PDN 101, via any eNodeB 106. Typically, the user equipment 104 can connect to the nearest, in terms of distance, eNodeB 106. In the LTE system 100, the EUTRAN 102 and EPC 108 work together to provide connectivity, mobility and services for the user equipment 104.

Figure 1C:
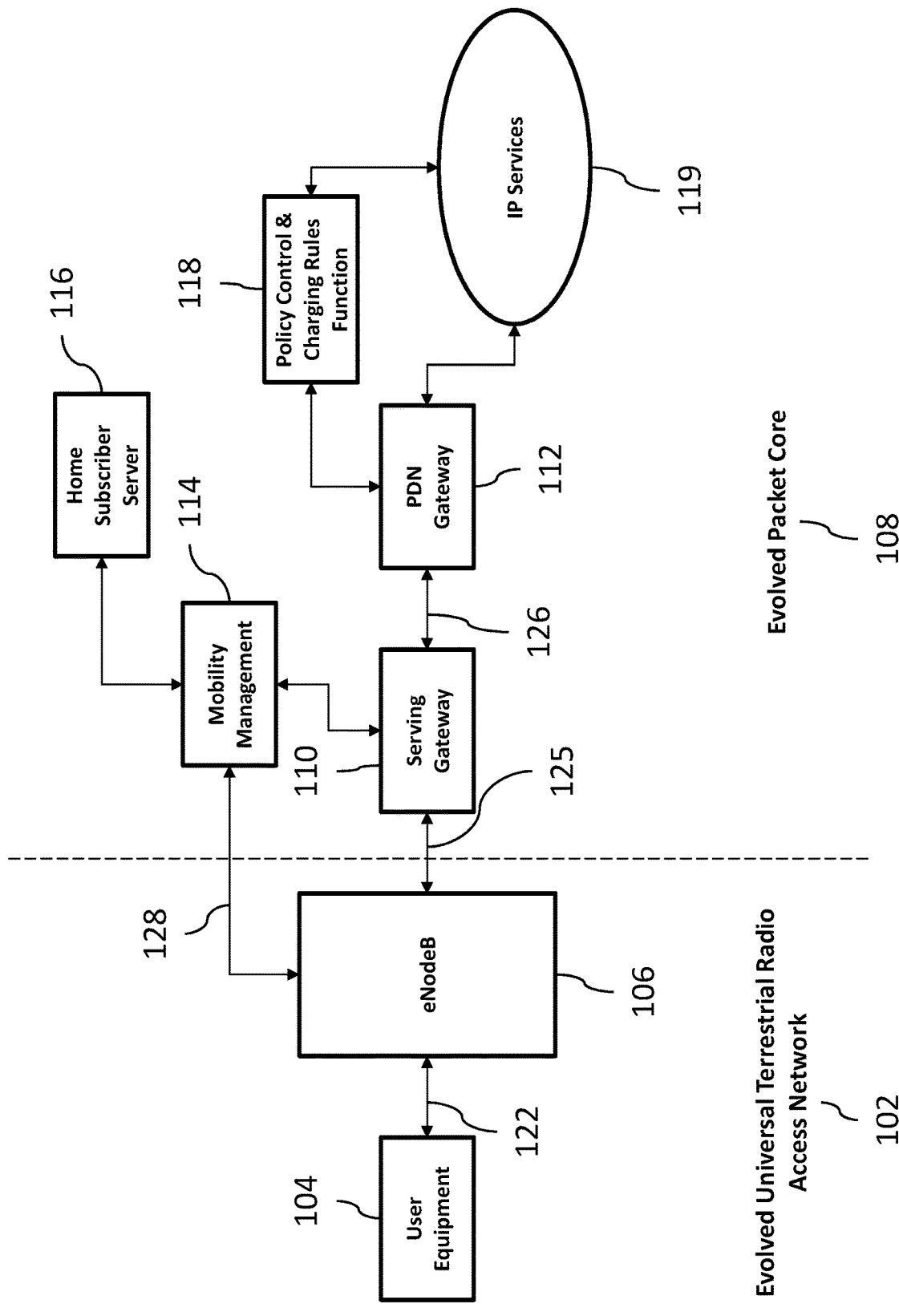

FIG. 1b illustrates further detail of the network 100 shown in FIG. 1a. As stated above, the EUTRAN 102 includes a plurality of eNodeBs 106, also known as cell sites. The eNodeBs 106 provides radio functions and performs key control functions including scheduling of air link resources or radio resource management, active mode mobility or handover, and admission control for services. The eNodeBs 106 are responsible for selecting which mobility management entities (MMEs, as shown in FIG. 1c) will serve the user equipment 104 and for protocol features like header compression and encryption. The eNodeBs 106 that make up an EUTRAN 102 collaborate with one another for radio resource management and handover.

Communication between the user equipment 104 and the eNodeB 106 occurs via an air interface 122 (also known as "LTE-Uu" interface). As shown in FIG. 1B, the air interface 122 provides communication between user equipment 104b and the eNodeB 106a. The air interface 122 uses Orthogonal Frequency Division Multiple Access ("OFDMA") and Single Carrier Frequency Division Multiple Access ("SC-FDMA"), an OFDMA variant, on the downlink and uplink respectively. OFDMA allows use of multiple known antenna techniques, such as, Multiple Input Multiple Output ("MIMO").

The air interface 122 uses various protocols, which include a radio resource control ("RRC") for signaling between the user equipment 104 and eNodeB 106 and non-access stratum ("NAS") for signaling between the user equipment 104 and MME (as shown in FIG. 1c). In addition to signaling, user traffic is transferred between the user equipment 104 and eNodeB 106. Both signaling and traffic in the system 100 are carried by physical layer ("PHY") channels.

Multiple eNodeBs 106 can be interconnected with one another using an X2 interface 130(a, b, c). As shown in FIG. 1a, X2 interface 130a provides interconnection between eNodeB 106a and eNodeB 106b; X2 interface 130b provides interconnection between eNodeB 106a and eNodeB 106c; and X2 interface 130c provides interconnection between eNodeB 106b and eNodeB 106c. The X2 interface can be established between two eNodeBs in order to provide an exchange of signals, which can include a load- or interference-related information as well as handover-related information. The eNodeBs 106 communicate with the evolved packet core 108 via an S1 interface 124(a, b, c). The S1 interface 124 can be split into two interfaces: one for the control plane (shown as control plane interface (S1-MME interface) 128 in FIG. 1c) and the other for the user plane (shown as user plane interface (S1-U interface) 125 in FIG. 1c).

The EPC 108 establishes and enforces Quality of Service ("QoS") for user services and allows user equipment 104 to maintain a consistent internet protocol ("IP") address while moving. It should be noted that each node in the network 100 has its own IP address. The EPC 108 is designed to interwork with legacy wireless networks. The EPC 108 is also designed to separate control plane (i.e., signaling) and user plane (i.e., traffic) in the core network architecture, which allows more flexibility in implementation, and independent scalability of the control and user data functions.

The EPC 108 architecture is dedicated to packet data and is shown in more detail in FIG. 1c. The EPC 108 includes a serving gateway (S-GW) 110, a PDN gateway (P-GW) 112, a mobility management entity ("MME") 114, a home subscriber server ("HSS") 116 (a subscriber database for the EPC 108), and a policy control and charging rules function ("PCRF") 118. Some of these (such as S-GW, P-GW, MME, and HSS) are often combined into nodes according to the manufacturer's implementation.

The S-GW 110 functions as an IP packet data router and is the user equipment's bearer path anchor in the EPC 108. Thus, as the user equipment moves from one eNodeB 106 to another during mobility operations, the S-GW 110 remains the same and the bearer path towards the EUTRAN 102 is switched to talk to the new eNodeB 106 serving the user equipment 104. If the user equipment 104 moves to the domain of another S-GW 110, the MME 114 will transfer all of the user equipment's bearer paths to the new S-GW. The S-GW 110 establishes bearer paths for the user equipment to one or more P-GWs 112. If downstream data are received for an idle user equipment, the S-GW 110 buffers the downstream packets and requests the MME 114 to locate and reestablish the bearer paths to and through the EUTRAN 102.

The P-GW 112 is the gateway between the EPC 108 (and the user equipment 104 and the EU IRAN 102) and PDN 101 (shown in FIG. 1a). The P-GW 112 functions as a router for user traffic as well as performs functions on behalf of the user equipment. These include IP address allocation for the user equipment, packet filtering of downstream user traffic to ensure it is placed on the appropriate bearer path, enforcement of downstream QoS, including data rate. Depending upon the services a subscriber is using, there may be multiple user data bearer paths between the user equipment 104 and P-GW 112. The subscriber can use services on PDNs served by different P-GWs, in which case the user equipment has at least one bearer path established to each P-GW 112. During handover of the user equipment from one eNodeB to another, if the S-GW 110 is also changing, the bearer path from the P-GW 112 is switched to the new S-GW.

The MME 114 manages user equipment 104 within the EPC 108, including managing subscriber authentication, maintaining a context for authenticated user equipment 104, establishing data bearer paths in the network for user traffic, and keeping track of the location of idle mobiles that have not detached from the network. For idle user equipment 104 that needs to be reconnected to the access network to receive downstream data, the MME 114 initiates paging to locate the user equipment and re-establishes the bearer paths to and through the EUTRAN 102. MME 114 for a particular user equipment 104 is selected by the eNodeB 106 from which the user equipment 104 initiates system access. The MME is typically part of a collection of MMES in the EPC 108 for the purposes of load sharing and redundancy. In the establishment of the user's data bearer paths, the MME 114 is responsible for selecting the P-GW 112 and the S-GW 110, which will make up the ends of the data path through the EPC 108.

The PCRF 118 is responsible for policy control decision-making, as well as for controlling the flow-based charging functionalities in the policy control enforcement function ("PCEF"), which resides in the P-GW 110. The PCRF 118 provides the QoS authorization (QoS class identifier ("QCI") and bit rates) that decides how a certain data flow will be treated in the PCEF and ensures that this is in accordance with the user's subscription profile.

As stated above, the IP services 119 are provided by the PDN 101 (as shown in FIG. 1*a*).

Figure 1D:
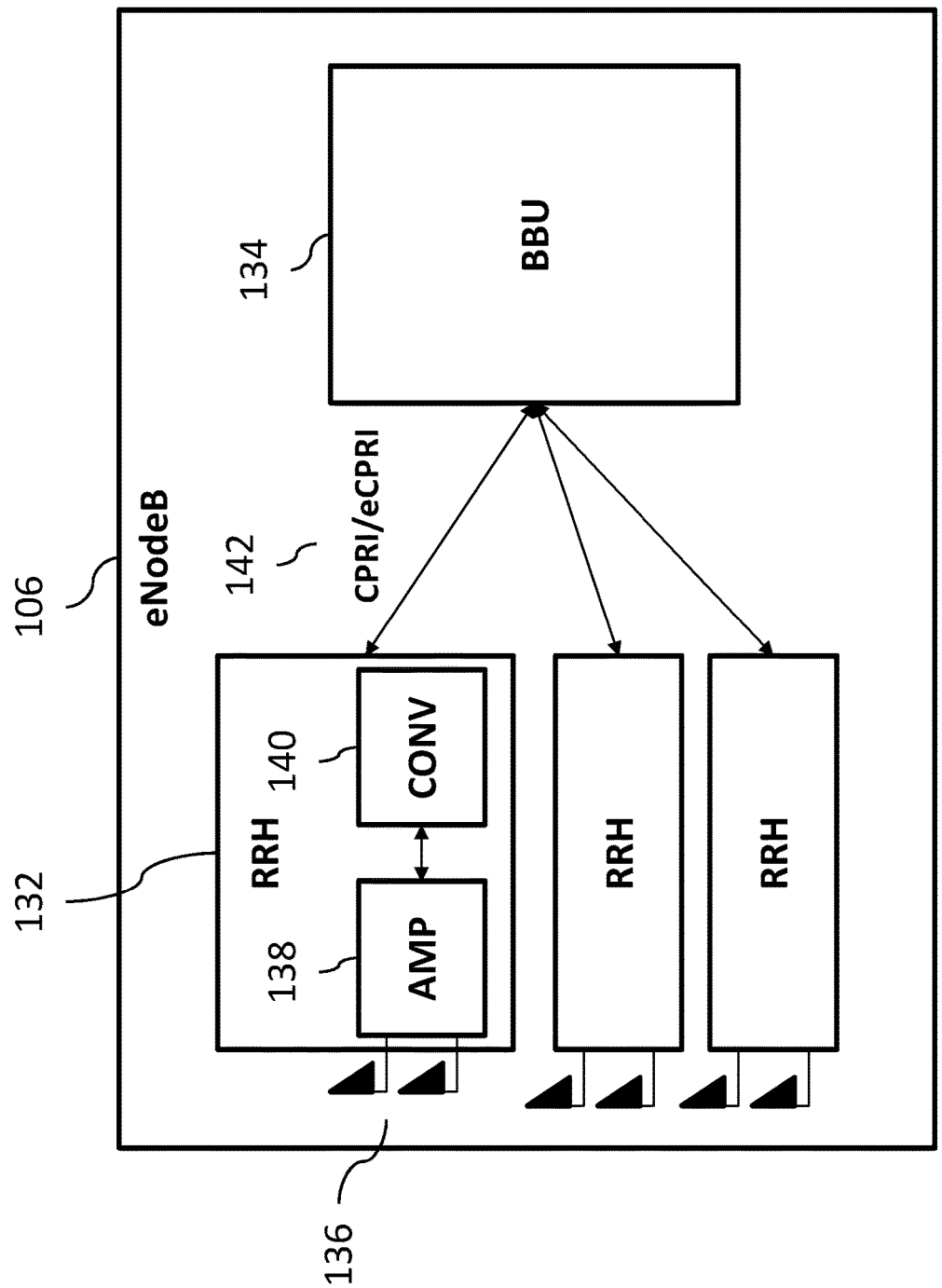

FIG. 1*d* illustrates an exemplary structure of eNodeB 106. The eNodeB 106 can include at least one remote radio head ("RRH") 132 (typically, there can be three RRH 132) and a baseband unit ("BBU") 134. The RRH 132 can be connected to antennas 136. The RRH 132 and the BBU 134 can be connected using an optical interface that is compliant with common public radio interface ("CPRI")/enhanced CPRI ("eCPRI") 142 standard specification either using RRH specific custom control and user plane framing methods or using O-RAN Alliance compliant Control and User plane framing methods. The operation of the eNodeB 106 can be characterized using the following standard parameters (and specifications): radio frequency band (Band4, Band9, Band17, etc.), bandwidth (5, 10, 15, 20 MHz), access scheme (downlink: OFDMA; uplink: SC-OFDMA), antenna technology (Single user and multi user MIMO; Uplink: Single user and multi user MIMO), number of sectors (6 maximum), maximum transmission rate (downlink 150 Mb/s; uplink: 50 Mb/s), S1/X2 interface (1000Base-SX, 1000Base-T), and mobile environment (up to 350 km/h). The BBU 134 can be responsible for digital baseband signal processing, termination of S1 line, termination of X2 line, call processing and monitoring control processing. IP packets that are received from the EPC 108 (not shown in FIG. 1*d*) can be modulated into digital baseband signals and transmitted to the RRH 132. Conversely, the digital baseband signals received from the RRH 132 can be demodulated into IP packets for transmission to EPC 108.

The RRH 132 can transmit and receive wireless signals using antennas 136. The RRH 132 can convert (using converter ("CONN") 140) digital baseband signals from the BBU 134 into radio frequency ("RF") signals and power amplify (using amplifier ("AMP") 138) them for transmission to user equipment 104 (not shown in FIG. 1*d*). Conversely, the RF signals that are received from user equipment 104 are amplified (using AMP 138) and converted (using CONY 140) to digital baseband signals for transmission to the BBU 134.

FIG. 2 illustrates an additional detail of an exemplary eNodeB 106. The eNodeB 106 includes a plurality of layers: LTE layer 1 202, LTE layer 2 204, and LTE layer 3 206. The LTE layer 1 includes a physical layer ("PHY"). The LTE layer 2 includes a medium access control ("MAC"), a radio link control ("RLC"), a packet data convergence protocol ("PDCP"). The LTE layer 3 includes various functions and protocols, including a radio resource control ("RRC"), a dynamic resource allocation, eNodeB measurement configuration and provision, a radio admission control, a connection mobility control, and radio resource management ("RRM"). The RLC protocol is an automatic repeat request ("ARQ") fragmentation protocol used over a cellular air interface. The RRC protocol handles control plane signaling of LTE layer 3 between the user equipment and the EUTRAN. RRC includes functions for connection establishment and release, broadcast of system information, radio bearer establishment/reconfiguration and release, RRC connection mobility procedures, paging notification and release, and outer loop power control. The PDCP performs IP header compression and decompression, transfer of user data and maintenance of sequence numbers for Radio Bearers. The BBU 134, shown in FIG. 1*d*, can include LTE layers L1-L3.

One of the primary functions of the eNodeB 106 is radio resource management, which includes scheduling of both uplink and downlink air interface resources for user equipment 104, control of bearer resources, and admission control. The eNodeB 106, as an agent for the EPC 108, is responsible for the transfer of paging messages that are used to locate mobiles when they are idle. The eNodeB 106 also communicates common control channel information over the air, header compression, encryption and decryption of the user data sent over the air, and establishing handover reporting and triggering criteria. As stated above, the eNodeB 106 can collaborate with other eNodeB 106 over the X2 interface for the purposes of handover and interference management. The eNodeBs 106 communicate with the EPC's MME via the S1-MME interface and to the S-GW with the S1-U interface. Further, the eNodeB 106 exchanges user data with the S-GW over the S1-U interface. The eNodeB 106 and the EPC 108 have a many-to-many relationship to support load sharing and redundancy among MMEs and S-GWs. The eNodeB 106 selects an MME from a group of MMEs so the load can be shared by multiple MMEs to avoid congestion.

II. 5G NR Wireless Communications Networks

In some implementations, the current subject matter relates to a 5G new radio ("NR") communications system. The 5G NR is a next telecommunications standard beyond the 4G/IMT-Advanced standards. 5G networks offer at higher capacity than current 4G, allow higher number of mobile broadband users per area unit, and allow consumption of higher and/or unlimited data quantities in gigabyte per month and user. This can allow users to stream high-definition media many hours per day using mobile devices, even when it is not possible to do so with Wi-Fi networks. 5G networks have an improved support of device-to-device communication, lower cost, lower latency than 4G equipment and lower battery consumption, etc. Such networks have data rates of tens of megabits per second for a large number of users, data rates of 100 Mb/s for metropolitan areas, 1 Gb/s simultaneously to users within a confined area (e.g., office floor), a large number of simultaneous connections for wireless sensor networks, an enhanced spectral efficiency, improved coverage, enhanced signaling efficiency, 1-10 ms latency, reduced latency compared to existing systems.

Figure 3:
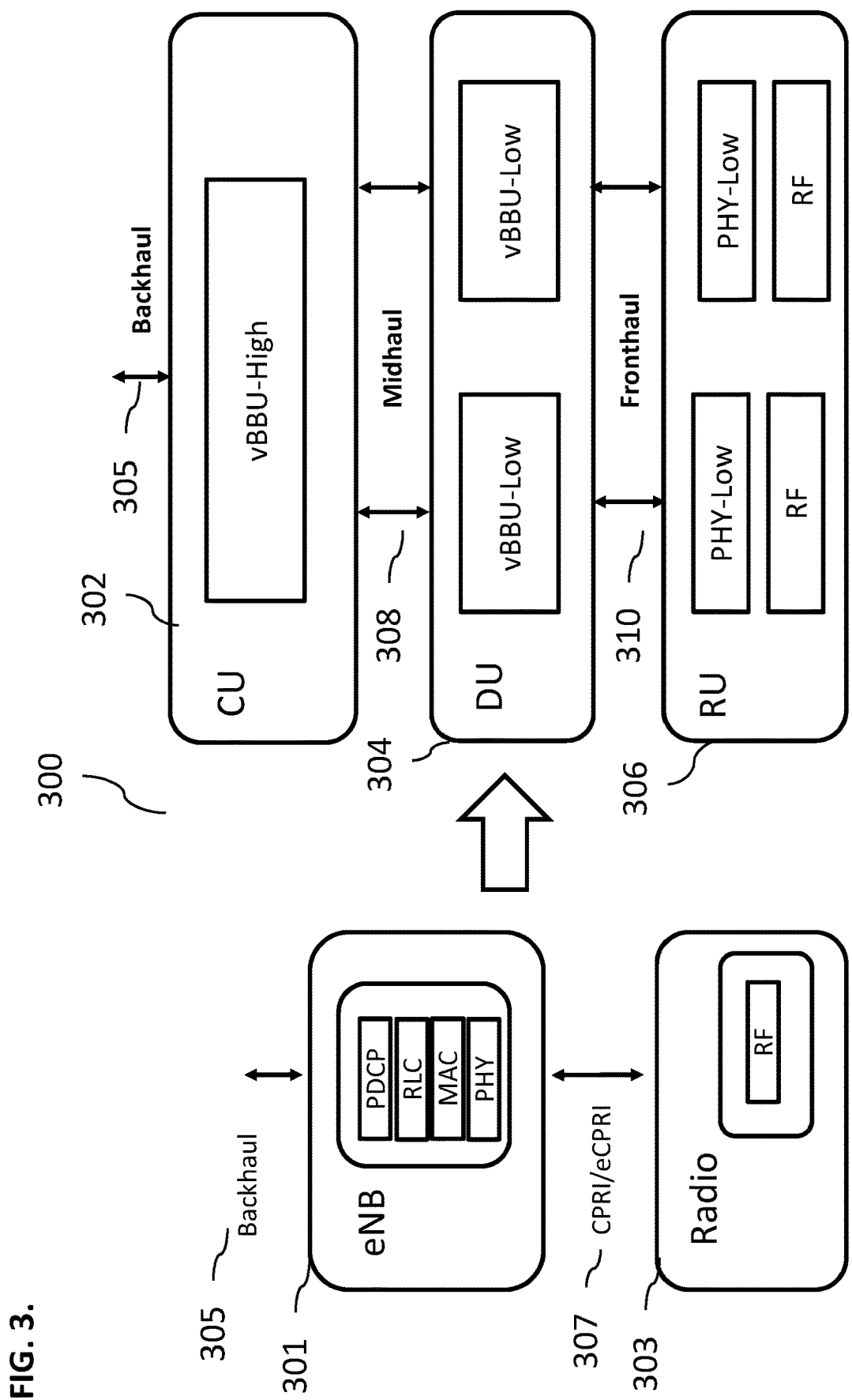
FIG. 3 illustrates an exemplary virtual radio access network, according to some implementations of the current subject matter.

FIG. 3 illustrates an exemplary virtual radio access network 300. The network 300 can provide communications between various components, including a base station (e.g., eNodeB, gNodeB) 301, a radio equipment 307, a centralized unit 302, a digital unit 304, and a radio device 306. The components in the system 300 can be communicatively coupled to a core using a backhaul link 305. A centralized unit ("CU") 302 can be communicatively coupled to a distributed unit ("DU") 304 using a midhaul connection 308. The radio frequency ("RU") components 306 can be communicatively coupled to the DU 304 using a fronthaul connection 310.

In some implementations, the CU 302 can provide intelligent communication capabilities to one or more DU units 308. The units 302, 304 can include one or more base stations, macro base stations, micro base stations, remote radio heads, etc. and/or any combination thereof.

In lower layer split architecture environment, a CPRI bandwidth requirement for NR can be 100s of Gb/s. CPRI compression can be implemented in the DU and RU (as shown in FIG. 3). In 5G communications systems, compressed CPRI over Ethernet frame is referred to as eCPRI and is the recommended fronthaul network. The architecture can allow for standardization of fronthaul/midhaul, which can include a higher layer split (e.g., Option 2 or Option 3-1 (Upper/Lower RLC split architecture)) and fronthaul with L1-split architecture (Option 7).

In some implementations, the lower layer-split architecture (e.g., Option 7) can include a receiver in the uplink, joint processing across multiple transmission points (TPs) for both DL/UL, and transport bandwidth and latency requirements for ease of deployment. Further, the current subject matter's lower layer-split architecture can include a split between cell-level and user-level processing, which can include cell-level processing in remote unit ("RU") and user-level processing in DU. Further, using the current subject matter's lower layer-split architecture, frequency-domain samples can be transported via Ethernet fronthaul, where the frequency-domain samples can be compressed for reduced fronthaul bandwidth.

Figure 4:
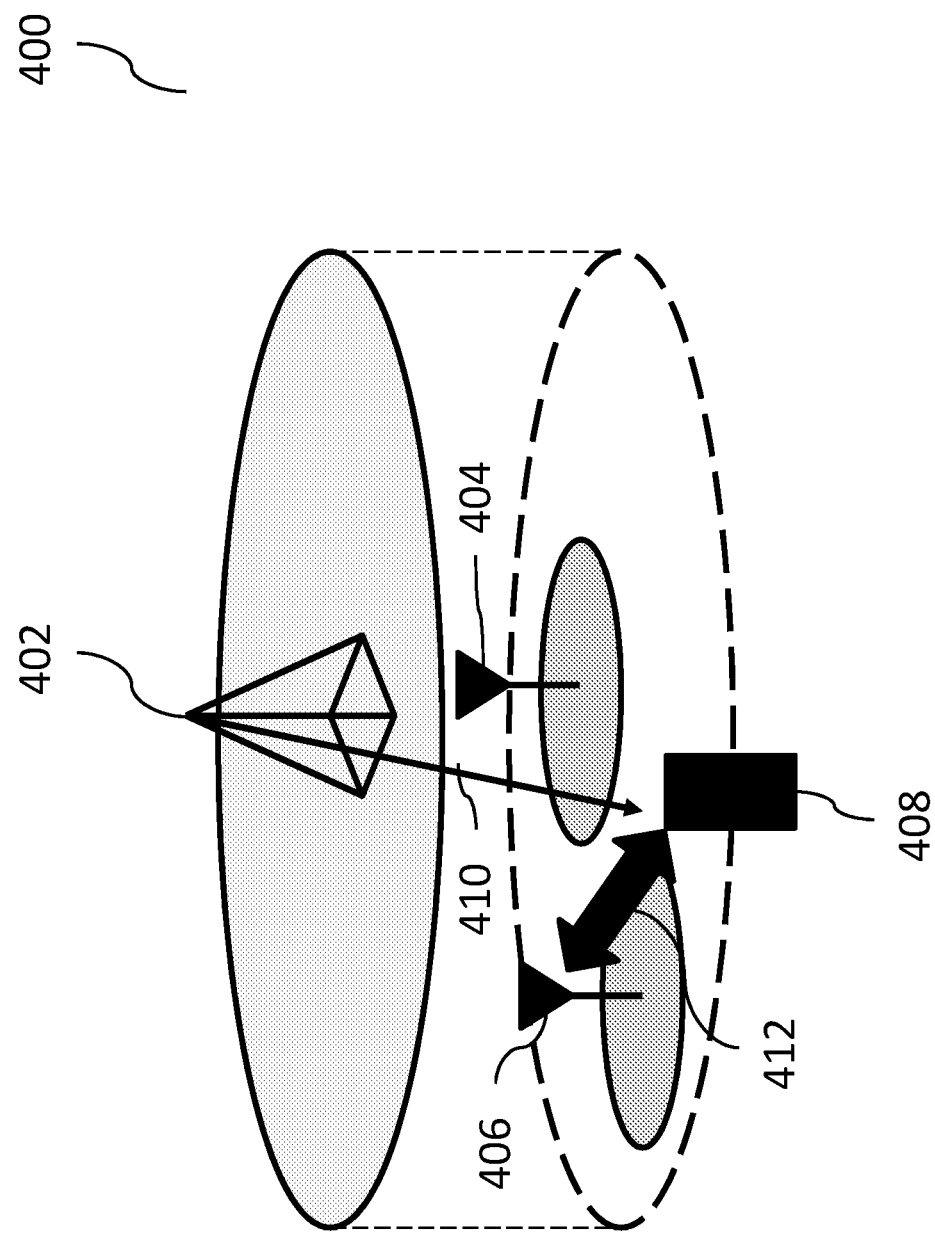
FIG. 4 illustrates an exemplary 3GPP split architecture to provide its users with use of higher frequency bands.

FIG. 4 illustrates an exemplary communications system 400 that can implement a 5G technology and can provide its users with use of higher frequency bands (e.g., greater than 10 GHz). The system 400 can include a macro cell 402 and small cells 404 and 406.

A mobile device 408 can be configured to communicate with one or more of the small cells 404, 406. The system 400 can allow splitting of control planes (C-plane) and user planes (U-plane) between the macro cell 402 and small cells 404, 406, where the C-plane and U-plane are utilizing different frequency bands. In particular, the small cells 402, 404 can be configured to utilize higher frequency bands when communicating with the mobile device 408. The macro cell 402 can utilize existing cellular bands for C-plane communications. The mobile device 408 can be communicatively coupled via U-plane 412, where the small cell (e.g., small cell 406) can provide higher data rate and more flexible/cost/energy efficient operations. The macro cell 402, via C-plane 410, can maintain good connectivity and mobility. Further, in some cases, LTE and NR can be transmitted on the same frequency.

Figure 5A:
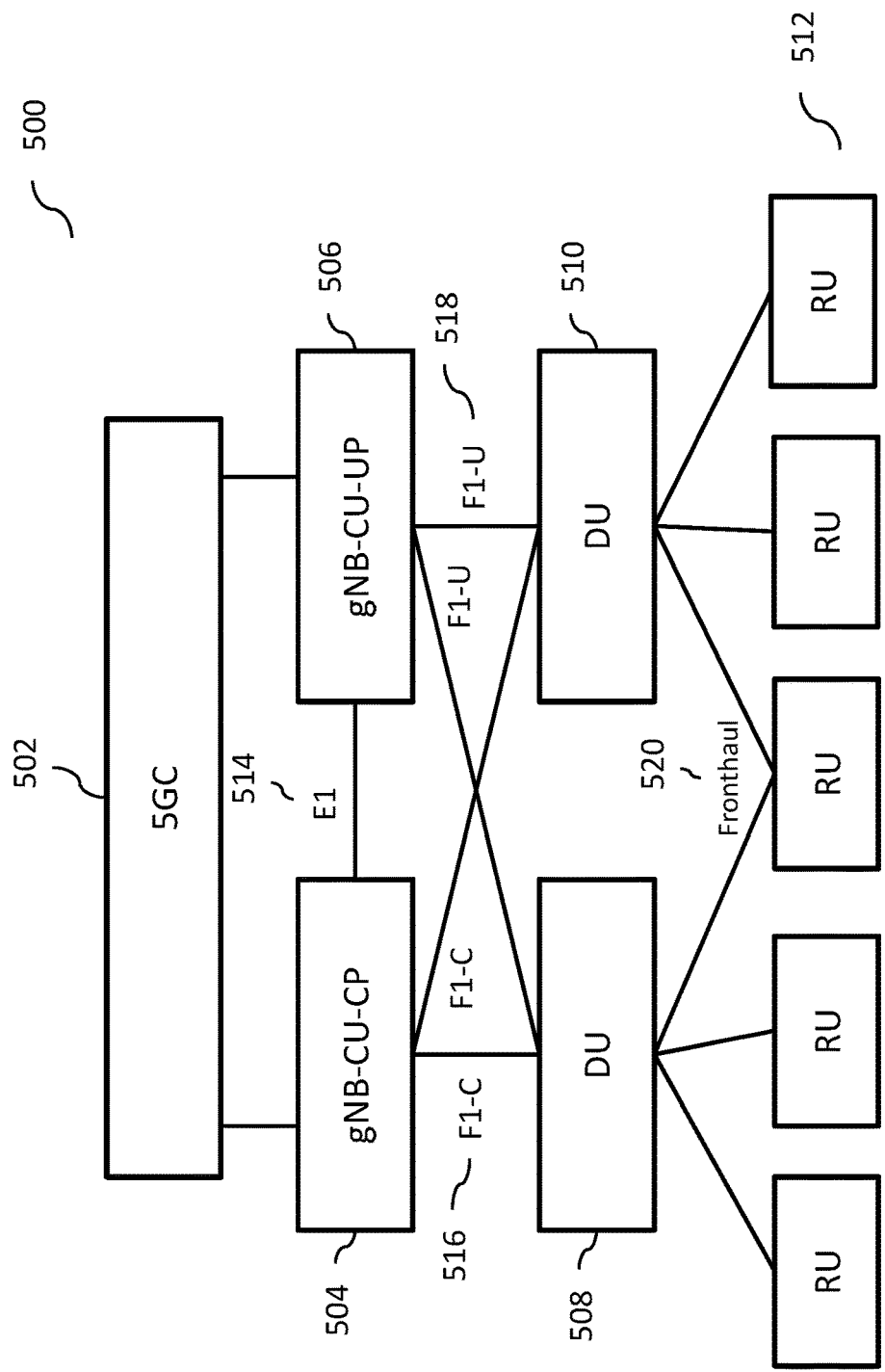
FIG. 5a illustrates an exemplary 5G wireless communication system.

FIG. 5a illustrates an exemplary 5G wireless communication system 500, according to some implementations of the current subject matter. The system 500 can be configured to have a lower layer split architecture in accordance with Option 7-2. The system 500 can include a core network 502 (e.g., 5G Core) and one or more gNodeBs (or gNBs), where the gNBs can have a centralized unit gNB-CU. The gNB-CU can be logically split into control plane portion, gNB-CU-CP, 504 and one or more user plane portions, gNB-CU-UP, 506. The control plane portion 504 and the user plane portion 506 can be configured to be communicatively coupled using an E1 communication interface 514 (as specified in the 3GPP Standard). The control plane portion 504 can be configured to be responsible for execution of the RRC and PDCP protocols of the radio stack.

The control plane and user plane portions 504, 506 of the centralized unit of the gNB can be configured to be communicatively coupled to one or more distributed units (DU) 508, 510, in accordance with the higher layer split architecture. The distributed units 508, 510 can be configured to execute RLC, MAC and upper part of PHY layers protocols of the radio stack. The control plane portion 504 can be configured to be communicatively coupled to the distributed units 508, 510 using F1-C communication interfaces 516, and the user plane portions 506 can be configured to be communicatively coupled to the distributed units 508, 510 using F1-U communication interfaces 518. The distributed units 508, 510 can be coupled to one or more remote radio units (RU) 512 via a fronthaul network 520 (which may include one or switches, links, etc.), which in turn communicate with one or more user equipment (not shown in FIG. 5a). The remote radio units 512 can be configured to execute a lower part of the PHY layer protocols as well as provide antenna capabilities to the remote units for communication with user equipments (similar to the discussion above in connection with FIGS. 1a-2).

Figure 5B:
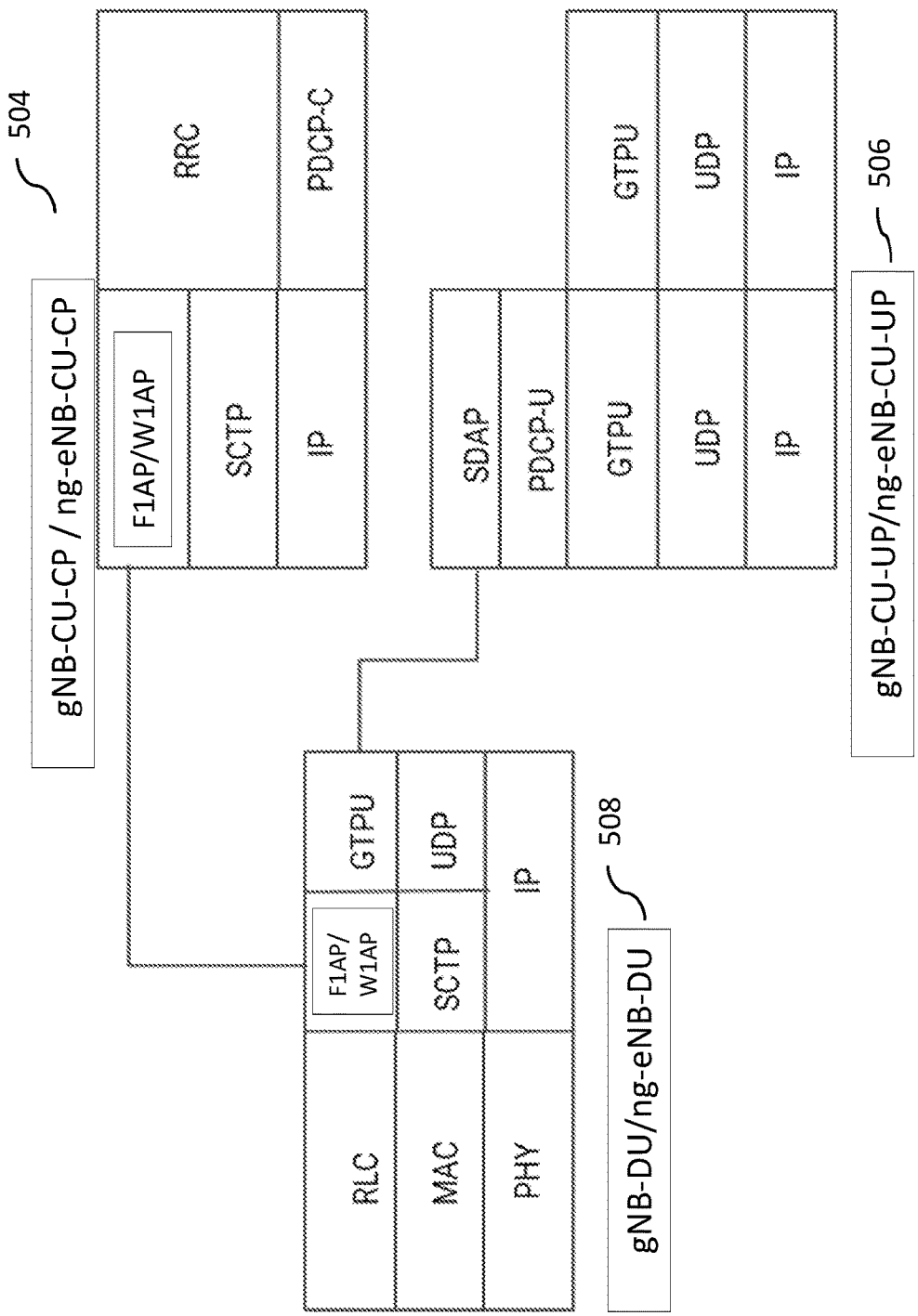
FIG. 5b illustrates an exemplary layer architecture of the split gNB and/or a split ng-eNB (e.g., next generation eNB that may be connected to 5GC)

FIG. 5b illustrates an exemplary layer architecture 530 of the split gNB. The architecture 530 can be implemented in the communications system 500 shown in FIG. 5a, which can be configured as a virtualized disaggregated radio access network (RAN) architecture, whereby layers L1, L2, L3 and radio processing can be virtualized and disaggregated in the centralized unit(s), distributed unit(s) and radio unit(s). As shown in FIG. 5b, the gNB-DU 508 can be communicatively coupled to the gNB-CU-CP control plane portion 504 (also shown in FIG. 5a) and gNB-CU-UP user plane portion 506. Each of components 504, 506, 508 can be configured to include one or more layers.

The gNB-DU 508 can include RLC, MAC, and PHY layers as well as various communications sublayers. These can include an F1 application protocol (F1-AP) sublayer, a GPRS tunneling protocol (GTPU) sublayer, a stream control transmission protocol (SCTP) sublayer, a user datagram protocol (UDP) sublayer and an internet protocol (IP) sublayer. As stated above, the distributed unit 508 may be communicatively coupled to the control plane portion 504 of the centralized unit, which may also include F1-AP, SCTP, and IP sublayers as well as radio resource control, and PDCP-control (PDCP-C) sublayers. Moreover, the distributed unit 508 may also be communicatively coupled to the user plane portion 506 of the centralized unit of the gNB. The user plane portion 506 may include service data adaptation protocol (SDAP), PDCP-user (PDCP-U), GTPU, UDP and IP sublayers.

Figure 5C:
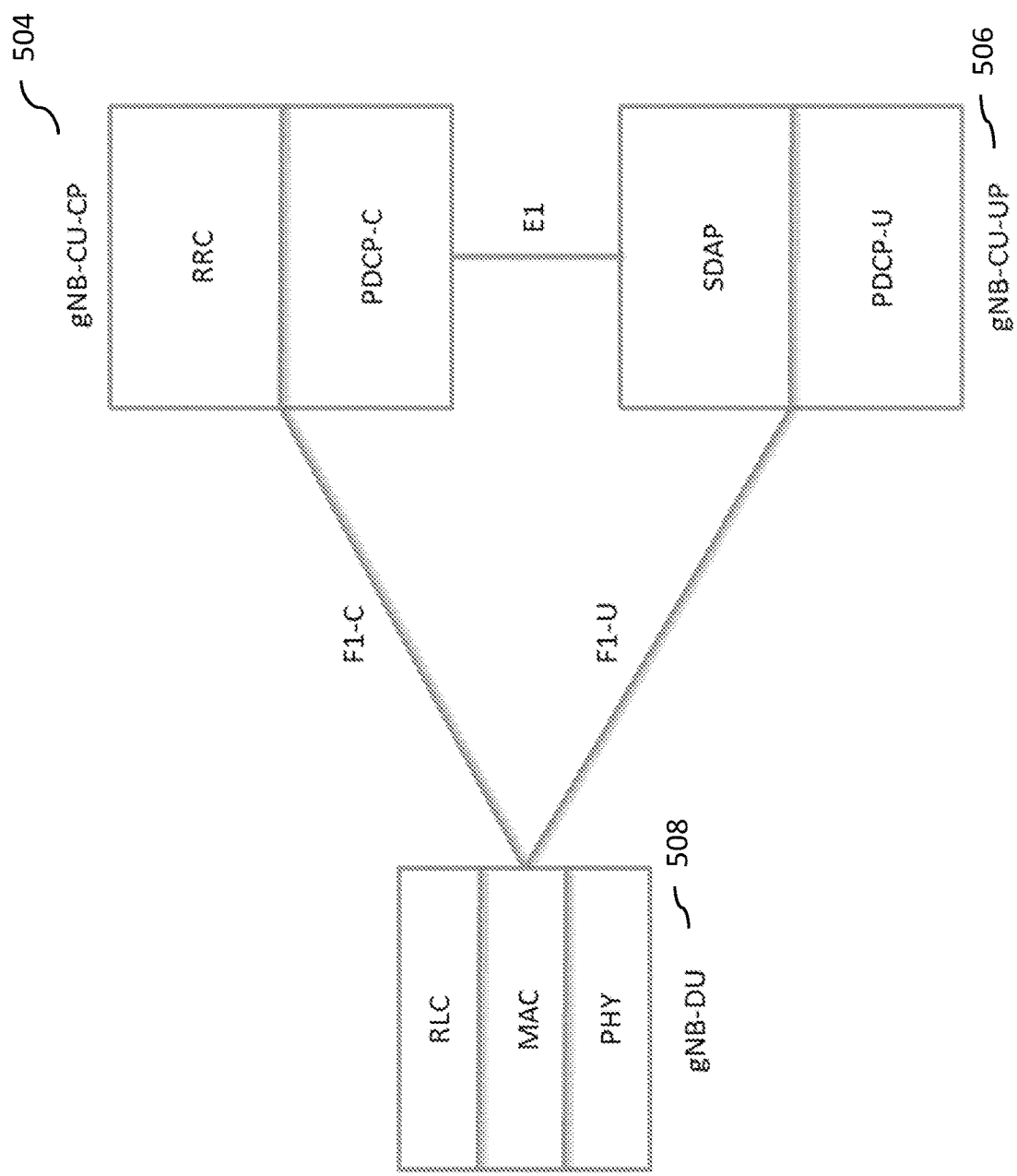
FIG. 5c illustrates an exemplary functional split in the gNB architecture shown in FIGS. 5a-b.

FIG. 5c illustrates an exemplary functional split in the gNB architecture shown in FIGS. 5a-b. As shown in FIG. 5c, the gNB-DU 508 may be communicatively coupled to the gNB-CU-CP 504 and GNB-CU-UP 506 using an F1-C communication interface. The gNB-CU-CP 504 and GNB-CU-UP 506 may be communicatively coupled using an E1 communication interface. The higher part of the PHY layer (or Layer 1) may be executed by the gNB-DU 508, whereas the lower parts of the PHY layer may be executed by the RUs (not shown in FIG. 5*c*). As shown in FIG. 5*c*, the RRC and PDCP-C portions may be executed by the control plane portion 504, and the SDAP and PDCP-U portions may be executed by the user plane portion 506.

Some of the functions of the PHY layer in 5G communications network can include error detection on the transport channel and indication to higher layers, FEC encoding/decoding of the transport channel, hybrid ARQ soft-combining, rate matching of the coded transport channel to physical channels, mapping of the coded transport channel onto physical channels, power weighting of physical channels, modulation and demodulation of physical channels, frequency and time synchronization, radio characteristics measurements and indication to higher layers, MIMO antenna processing, digital and analog beamforming, RF processing, as well as other functions.

The MAC sublayer of Layer 2 can perform beam management, random access procedure, mapping between logical channels and transport channels, concatenation of multiple MAC service data units (SDUs) belonging to one logical channel into transport block (TB), multiplexing/demultiplexing of SDUs belonging to logical channels into/from TBs delivered to/from the physical layer on transport channels, scheduling information reporting, error correction through HARQ, priority handling between logical channels of one UE, priority handling between UEs by means of dynamic scheduling, transport format selection, and other functions. The RLC sublayer's functions can include transfer of upper layer packet data units (PDUs), error correction through ARQ, reordering of data PDUs, duplicate and protocol error detection, re-establishment, etc. The PDCP sublayer can be responsible for transfer of user data, various functions during re-establishment procedures, retransmission of SDUs, SDU discard in the uplink, transfer of control plane data, and others.

Layer 3's RRC sublayer can perform broadcasting of system information to NAS and AS, establishment, maintenance and release of RRC connection, security, establishment, configuration, maintenance and release of point-point radio bearers, mobility functions, reporting, and other functions.

III. Self-Cooling Chassis for Communication Devices

Figure 6:
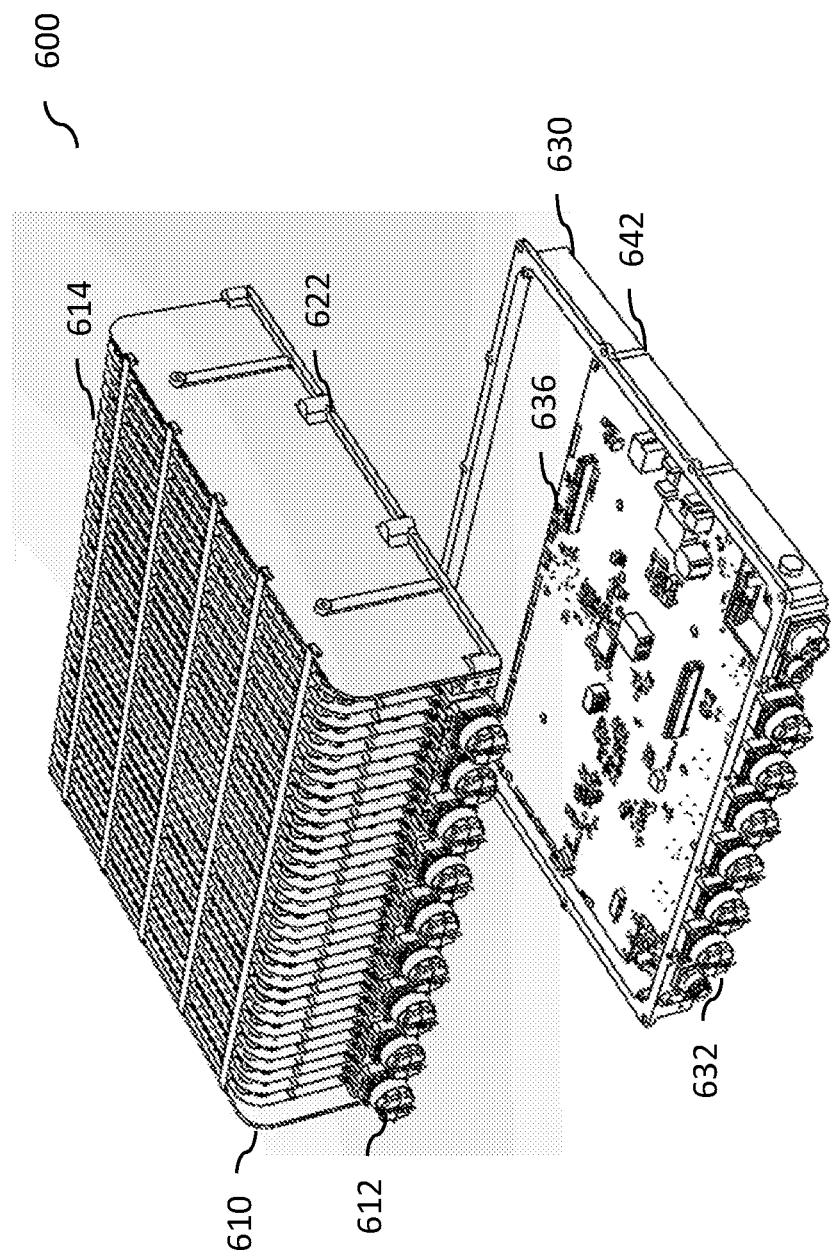
FIG. 6 is an exploded view of a top housing and a bottom housing of an exemplary self-cooling chassis for a communications device, according to some implementations of the current subject matter.

FIG. 6 is an exploded view of a self-cooling chassis 600 for a communications device that may be implemented in a wireless communication system, according to some implementations of the current subject matter. The self-cooling chassis 600 may include a top housing 610, a bottom housing 630, a first set of input/output (I/O) connectors 612, a second set of I/O connectors 632, a plurality of heat fins 614, a top housing alignment fastener 622, a bottom housing alignment aperture 642, and an I/O circuitry 636. The top housing 610 and a bottom housing 630 may be configured to couple together.

The top housing 610 includes a first set of I/O connectors 612 on the front side of the top housing 610. The first set of I/O connectors 612 may be arranged in a linear pattern along the front side of the top housing 610. Alternatively, or in addition to, the first set of I/O connectors 612 may be arranged in a staggered or checkered pattern along the front side of the top housing 610. The first set of I/O connectors 612 may be radio signal access connectors. The first set of I/O connectors 612 may be configured to receive or transmit signals between the communications device and a receiving unit, a gNodeB base station, an eNodeB base station, or any combination thereof. The first set of I/O connectors 612 may be communicatively coupled to the processor 1021 at a processing circuitry 820 (not shown in FIG. 6).

The top housing 610 may include a plurality of heat fins 614 arranged at a top side of the top housing 610. The plurality of heat fins 614 may be configured to dissipate heat way from the processor 1021. The plurality of heat fins 614 may face one another. The plurality of heat fins 614 may extend in the same direction across the top side of the top housing 610. For example, the plurality of heat fins 614 may extend in a direction perpendicular to the direction from which the front side of the top housing 610 extends. In another example, the plurality of heat fins 614 may extend in a direction parallel to the direction from which the front side of the top housing 610 extends. The plurality of heat fins 614 may be two-phase heat fins and the plurality of heat fins 614 may be configured to have a predetermined pitch extending along the top side of the top housing 610. In some implementations, the fins may be two-phase press fit fins.

In some implementations, the plurality of heat fins 614 may create a convection pathway when the self-cooling chassis 600 is in an upright position. Heated air near the bottom end of the plurality of heat fins 614 may rise through the open pathway up towards to top end of the plurality of heat fins 614. The heated air may exit through the top end of the plurality of heat fins 614 and the cooler air may be drawn in through the bottom end of the plurality of heat fins 614 without the use of fans.

The top housing 610 may include a top housing alignment fastener 622. The top housing alignment fastener 622 and the bottom housing alignment aperture 642 may fasten the top housing 610 to the bottom housing 630. The top housing alignment fastener 622 may be located at an edge or a corner of the top housing 610. The top housing alignment fastener 622 at the top housing 610 may have a downward protrusion to be received at a bottom housing alignment aperture 642 at the bottom housing 630. The top housing alignment fastener 622 may be configured to align the top housing 610 with the bottom housing 630. The top housing alignment fastener 622 may enable a linear alignment of the top housing 610 and the bottom housing 630 through connection of the top housing alignment fastener 622 and the bottom housing alignment aperture 642. The top housing alignment fastener 622 may be configured to enable control of a final linear alignment of the top housing 610 and the bottom housing 630. Following final linear alignment, the top housing alignment fastener 622 may be inserted into the bottom housing alignment aperture 642 to fasten the top housing 610 to the bottom housing 630.

Referring still to FIG. 6, the bottom housing 630 may include a second set of I/O connectors 632 on the front side of the top housing 610. The second set of I/O connectors 632 may be arranged in a linear pattern along the front side of the bottom housing 630. Alternatively, the second set of I/O connectors 632 may be arranged in a staggered or checkered pattern along the front side of the bottom housing 630. The second set of I/O connectors 632 may be radio signal access connectors. The second set of I/O connectors 632 may be configured to receive or transmit signals between the communications device and a receiving unit, a gNodeB base station, an eNodeB base station, or any combination thereof. The second set of I/O connectors 632 may be communicatively coupled to the processor 1021 at the processing circuitry 820 (not shown in FIG. 6).

The bottom housing 630 may include the bottom housing alignment aperture 642. The bottom housing alignment aperture 642 may be located at an edge or a corner of the bottom housing 630. The bottom housing alignment aperture 642 at the bottom housing 630 may be configured to receive a downward protrusion from the top housing alignment fastener 622 at the top housing 610. The bottom housing alignment aperture 642 may be configured to align the bottom housing 630 with the top housing 610. The bottom housing alignment aperture 642 may enable a linear alignment of the bottom housing 630 and the top housing 610 through connection of the top housing alignment fastener 622 and the bottom housing alignment aperture 642. The bottom housing alignment aperture 642 may be configured to enable control of a final linear alignment of the top housing 610 and the bottom housing 630.

The bottom housing 630 may include an input/output (I/O) circuitry 636. The I/O circuitry 636 may be communicatively coupled to the second set of high-speed connector 632. The second set of I/O connectors 632 may couple to the processor 1021 (not shown in FIG. 6) upon coupling the I/O circuitry 636 to the processing circuitry 820 (not shown in FIG. 6) at the top housing 610.

Figure 7:
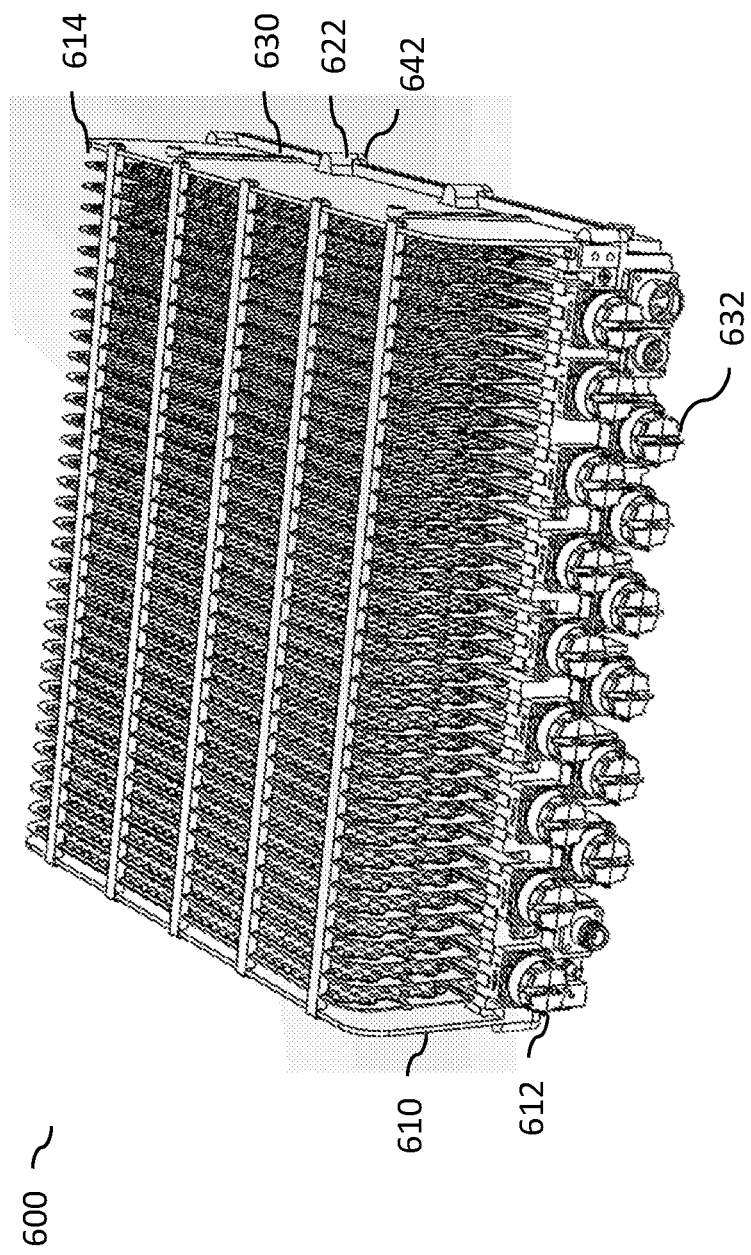
FIG. 7 is an assembled view of a top housing and a bottom housing of the self-cooling chassis for the communications device, according to some implementations of the current subject matter.

FIG. 7 is an assembled view of a top housing 610 and a bottom housing 630 of the self-cooling chassis for the communications device, according to some implementations of the current subject matter. The top housing 610 and the bottom housing 630 may be coupled together to form the self-cooling chassis 600. A method for assembling the apparatus may include providing the top housing 610 and the bottom housing 630, aligning the front side of the top housing with the front side of the bottom housing, and controlling a linear alignment of the top housing 610 with the bottom housing 630 via the top housing alignment fastener 622 and the bottom housing alignment aperture 642.

The top housing 610 may be aligned with the bottom housing 630. The top housing 610 may include a first set of I/O connectors 612 arranged along a front side of the top housing 610. The top housing 610 may have a top side including a plurality of heat fins 614 configured to dissipate heat away from the processor. The bottom housing 630 may include a second set of I/O connectors 632 arranged along a front side of the bottom housing 630. The bottom housing 630 may be configured to house an input/output (I/O) circuitry 636. The I/O circuitry 636 is configured to communicatively couple the second set of I/O connectors 632 to the processor.

The aligning of the top housing 610 with the bottom housing 630 may include aligning the front side of the top housing 610 with the front side of the bottom housing 630. The linear alignment of the top housing 610 and the bottom housing 630 may be controlled through connection of a top housing alignment connector and a bottom housing alignment connector.

The self-cooling chassis 600 formed from the top housing 610 and the bottom housing 630 may overcome problems with preventing overheating and aligning the first set of I/O connectors 612 with the second set of I/O connectors 632. The self-cooling chassis 600 may help control the temperature of the communications device and prevent overheating. The communications device may easily overheat given its responsibilities of processing higher layer radio protocols, (e.g., MAC, RLC, etc.). The self-cooling chassis 600 is particularly important to eliminate the need for a temperature-regulating cabinet and to reduce or eliminate energy costs related to providing a temperate environment for the communications device.

Figure 8:
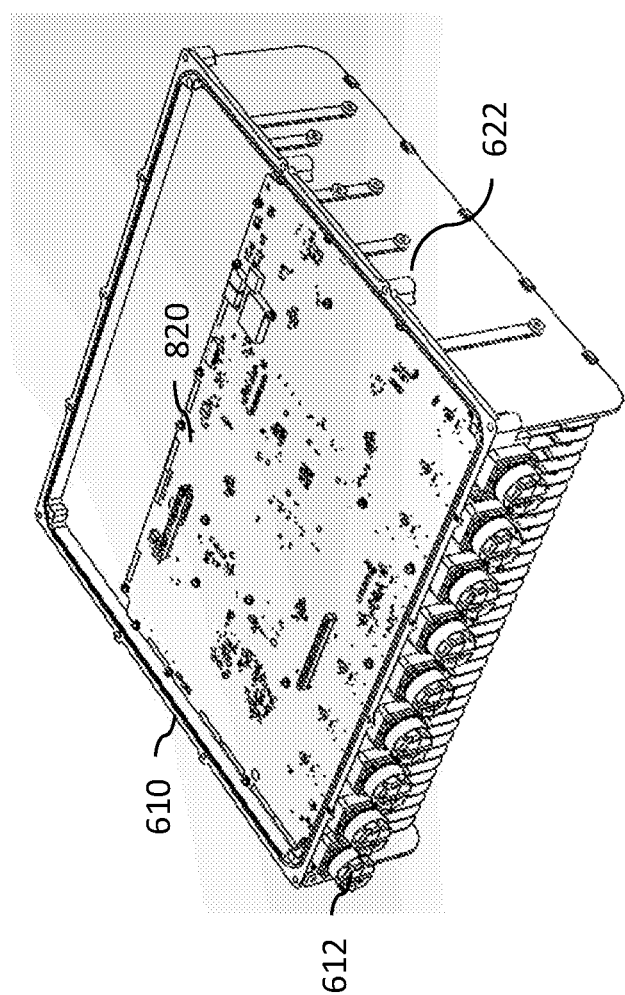
FIG. 8 is a bottom view of a top housing including the processing circuitry, according to some implementations of the current subject matter.

FIG. 8 is a bottom view of a top housing 610 including the processing circuitry 820, according to some implementations of the current subject matter. The top housing 610 may include processing circuitry 820. The processing circuitry 820 may be communicatively coupled to the first set of I/O connectors 612. The first set of I/O connectors 612 may be coupled one side of the processing circuitry 820. The processing circuitry 820 may be communicatively coupled to the second set of I/O connectors 632 upon coupling the top housing 610 to the bottom housing 630. The processing circuitry 820 may include the processor 1021 (not shown in FIG. 8). The processor 1021 may be communicatively coupled to the set of high speed connectors.

The processing circuitry 820 may include a top side and a bottom side. The top side includes the processor 1021 (not shown in FIG. 8) that is communicatively coupled to the first set of I/O connectors 612. The bottom side may include interface circuitry for interfacing with the I/O circuitry 636. For example, the interface circuitry at the processing circuitry 820 may include a set of connector pads that are configured to receive connection pins at the I/O circuitry 636 at the bottom housing 630. Alternatively, the interface circuitry at the processing circuitry 820 may include connection pins that are configured to connect to the connector pads at the I/O circuitry 636 at the bottom housing 630.

Figure 9:
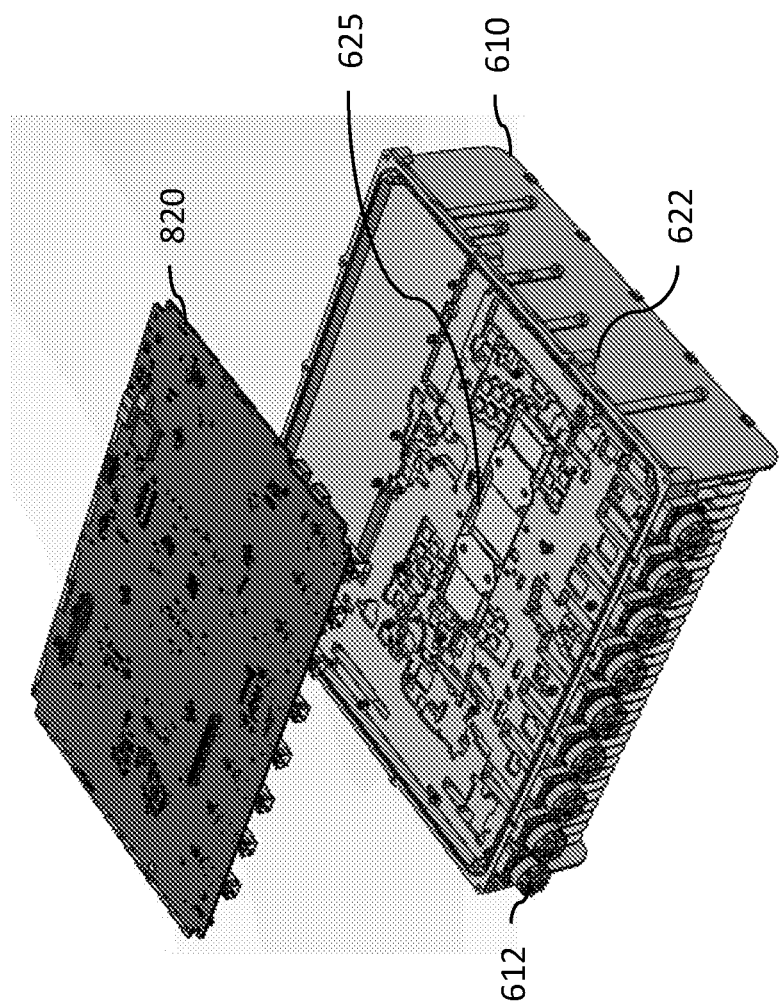
FIG. 9 is a bottom view of a top housing including an embedded vapor chamber, according to some implementations of the current subject matter.

FIG. 9 is a bottom view of a top housing 610 including an embedded vapor chamber 625, according to some implementations of the current subject matter, according to some implementations of the current subject matter. The embedded vapor chamber 625 may be configured to dissipate heat away from the processor 1021. The embedded vapor chamber 625 may be positioned directly above the processor 1021. The embedded vapor chamber 625 may be positioned between the top portion of the top housing 610 and the processor 1021. In some implementations, the embedded vapor chamber 625 may extend in the same direction as the front side of the top housing 610. In some implementations, the embedded vapor chamber 625 may include a cutout for receiving the processor 1021.

Figure 10:
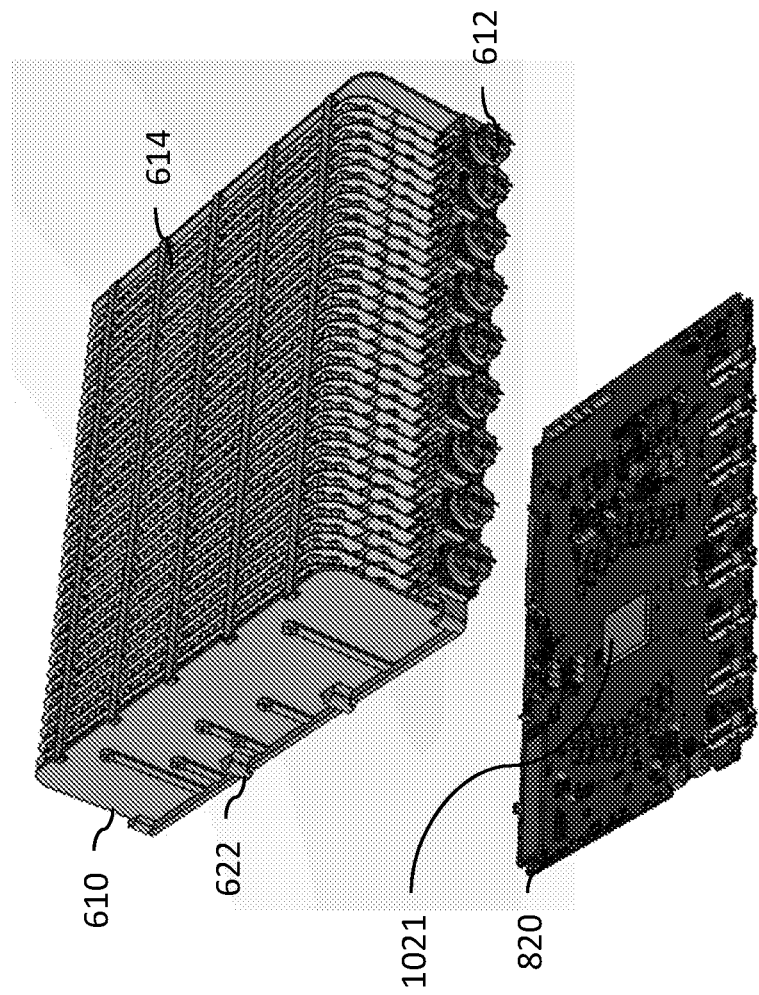
FIG. 10 is an exploded view of a top housing including the at least one processor, according to some implementations of the current subject matter.

FIG. 10 is an exploded view of a top housing including the processor 1021, according to some implementations of the current subject matter, according to some implementations of the current subject matter. The processor 1021 may be coupled to the top side of the processing circuitry 820. In some implementations, the processor 1021 may be centered in the processing circuitry 820 to maximize the heat dissipation.

The components of the self-cooling chassis 600 may be arranged in a specific configuration for maintaining the processor 1021 and the I/O circuitry 636 at a cool temperature without the need for a temperature-regulating cabinet. In another embodiment, the self-cooling chassis 600 may include plurality of heat fins 614 extending in one direction across the top side of the top housing 610 and the top housing 610 front side extending in a perpendicular direction. The self-cooling chassis 600 may be positioned in different environments and locations. This is advantageous over previous systems as communications devices may be freestanding and untethered to temperature-regulating cabinets.

Figure 11:
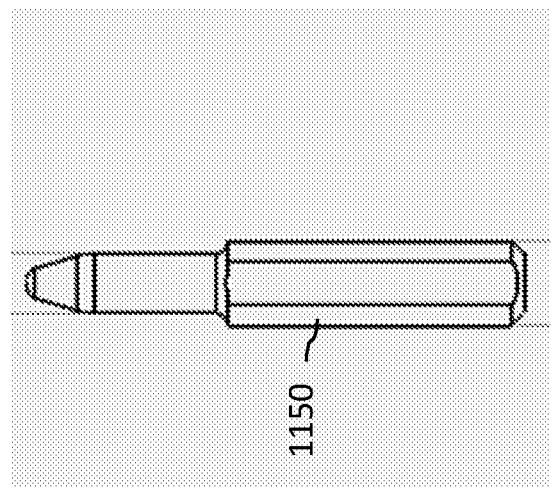
FIG. 11 is an exemplary guide pin for coupling the top housing to the bottom housing, according to some implementations of the current subject matter.

FIG. 11 is an exemplary guide pin 1150 for coupling the top housing 610 to the bottom housing 630, according to some implementations of the current subject matter. The guide pin 1150 may include two ends: one end for inserting inside the aperture of the top housing 610 and the other end for inserting inside the aperture of the bottom housing 630. In some implementations, the guide pin 1150 may be thicker at one end than at the other end. In some implementations, the guide pin 1150 may have a different shape at one end than the other end. For example, the guide pin 1150 may have a rectangular shape at one end and a cylindrical shape at the other end.

Figure 12:
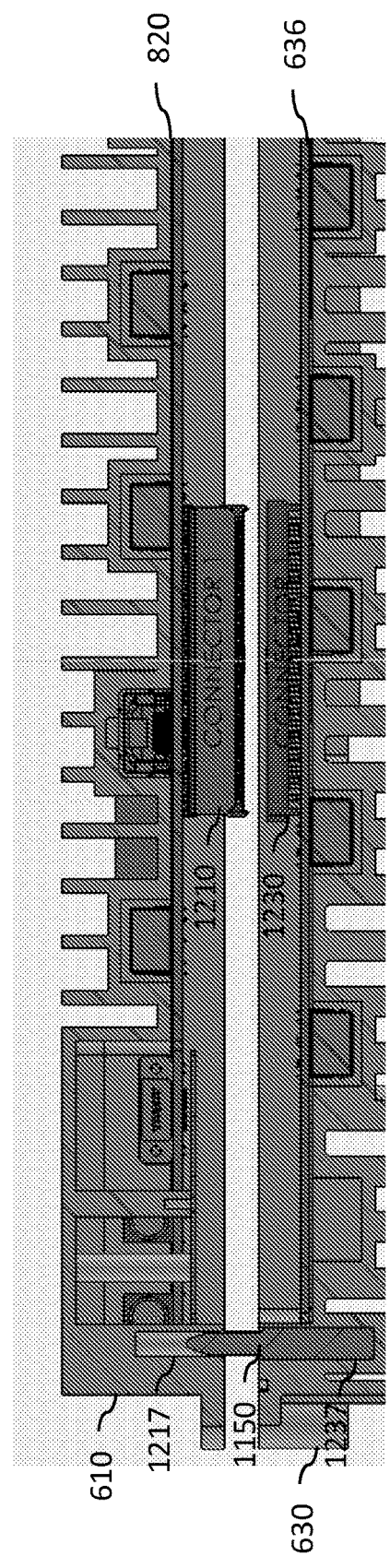
FIG. 12 is the guide pin shown in FIG. 11 and a top housing interface connector and a bottom housing interface connector, according to some implementations of the current subject matter.

FIG. 12 is the guide pin shown in FIG. 11 and a top housing interface connector and a bottom housing interface connector, according to some implementations of the current subject matter. The top housing 610 may include the top housing aperture 1217 and the bottom housing 630 may include the bottom housing aperture 1237. The guide pin 1150 may enable the alignment of the top housing 610 to the bottom housing 630 using the top housing aperture 1217 and the bottom housing aperture 1237. The processing circuitry 820 at the top housing 610 may have a processing-side high-speed connector 1210. The I/O circuitry 636 at the bottom housing 630 may have the I/O-side high-speed connector 1230. The guide pin 1150 may also enable the alignment of the processing-side high-speed connector 1210 with the I/O-side high-speed connector 1230.

The top housing 610 may include a top housing aperture 1217 positioned at an edge or a corner of the top housing 610. The top housing aperture 1217 may pass through a portion of the top housing 610 and may not be visible when the top housing 610 and the bottom housing 630 are coupled together. The top housing aperture 1217 may be arranged along the top housing 610 to align with the bottom housing aperture 1237 at the bottom housing 630. The guide pin 1150 may be configured to fit inside the top housing aperture 1217. In some implementations, the top housing aperture 1217 may be configured to accept one end of the guide pin 1150. In some implementations, the top housing aperture 1217 may be configured to receive both ends of the guide pin 1150.

The bottom housing 630 may include a bottom housing aperture 1237 positioned at an edge or a corner of the bottom housing 630. The bottom housing aperture 1237 may pass through a portion of the bottom housing 630 and may not be visible when the top housing 610 and the bottom housing 630 are coupled together. The bottom housing aperture 1237 may be arranged along the bottom housing 630 to align with the bottom housing aperture 1237. The guide pin 1150 may be configured to fit inside the bottom housing aperture 1237. In some implementations, the bottom housing aperture 1237 may be configured to accept one end of the guide pin 1150. In some implementations, the bottom housing aperture 1237 may be configured to receive both ends of the guide pin 1150. The guide pin 1150 may be applied to align the bottom housing aperture 1237 with the top housing aperture 1217.

The guide pin 1150 may be applied to align the top housing aperture 1217 of the top housing 610 with the bottom housing aperture 1237. The guide pin 1150 may be inserted at the top housing aperture 1217 and the bottom housing aperture 1237. In some implementations, a thicker end of the guide pin 1150 may be inserted into the bottom housing aperture 1237. The top housing aperture 1217 may be controlled with the guide pin 1150 to align the top housing 610 with the bottom housing 630. Aligning the first aperture of the top housing 610 with the second aperture of the bottom housing 630 using the guide pin 1150 may include aligning the top housing front side with the bottom housing front side. Additionally, the top housing aperture 1217 may be controlled with the guide pin 1150 to align the processing circuitry 820 with the I/O circuitry 636.

The processing circuitry 820 may include processing-side high-speed connector 1210 for interfacing the processing circuitry 820 with the I/O circuitry 636. For example, the processing-side high-speed connector 1210 at the top housing 610 may include a set of connector pads that are configured to receive connection pins at the I/O circuitry 636 at the bottom housing 630. Alternatively, the processing-side high-speed connector 1210 may include connection pins that are configured to connect to the connector pads at the I/O circuitry 636 at the bottom housing 630. The I/O circuitry 636 may include I/O-side high-speed connector 1230 for interfacing with the processing circuitry 820. For example, the I/O-side high-speed connector 1230 may include a set of connector pads that are configured to receive connection pins at the processing circuitry 820 at the top housing 610. Alternatively, the I/O-side high-speed connector 1230 may include connection pins that are configured to connect to the connector pads at processing circuitry 820 at the top housing 610.

The guide pin 1150 may also enable the alignment of the processing-side high-speed connector 1210 with the I/O-side high-speed connector 1230. The guide pin 1150 may enable alignment of the connection pins at the processing-side high-speed connector 1210 with the connection pads at the I/O-side high-speed connector 1230. Additionally, and/or alternatively, guide pin 1150 may enable alignment of the connection pads at the processing-side high-speed connector 1210 with the connection pins at the I/O-side high-speed connector 1230. In some embodiments, guide pins may be positioned in each corner of the top housing 610 and/or the bottom housing 630 to enable precision alignment of the processing-side high-speed connector 1210 with the I/O-side high-speed connector 1230.

Figure 13:
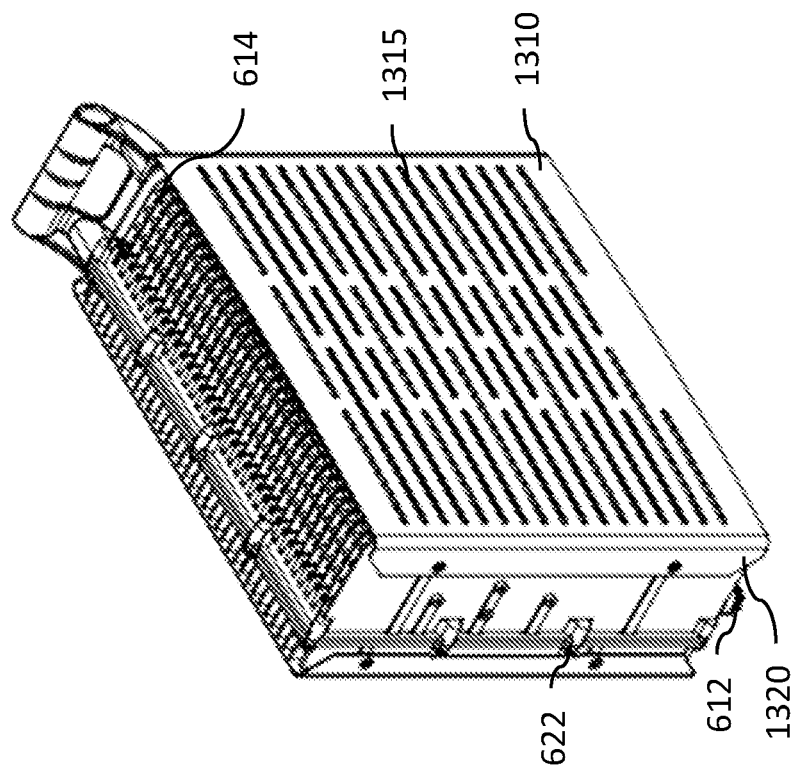
FIG. 13 is a perspective view of the self-cooling chassis of the communications unit including an exemplary solar shield coupled to a self-cooling chassis of the communications unit, according to some implementations of the current subject matter.

FIG. 13 is a perspective view of the self-cooling chassis 600 of the communications unit including an exemplary solar shield 1310 coupled to a self-cooling chassis 600 of the communications unit, according to some implementations of the current subject matter. The solar shield may include a plurality of ventilation slots 1315.

The solar shield 1310 may be configured to couple to the end of the plurality of heating fins 614 opposite the top side of the top housing 610. The solar shield 1310 may be configured to cover the plurality of heat fins 614 on the top housing 610 for mitigating solar radiation absorbed by the plurality of heat fins 614 while increasing air intake through the plurality of heat fins 614. In some implementations, the solar shield 1310 may include a lip 1320 extending over the side of the plurality of fins for coupling to the plurality of fins. In some implementations, the solar shield 1310 exposes a far end of the plurality of heat fins 614 in which the plurality of heat fins 614 extends. The solar shield 1310 enables the self-cooling chassis 600 to be stacked side-by-side with other self-cooling chassis 600 while maintaining the self-cooling chassis 600 below thermal thresholds.

The solar shield 1310 may include a plurality of ventilation slots 1315 for allowing heat dissipation from the plurality of heat fins 614. In some implementations, the plurality of ventilation slots 1315 may extend in a direction perpendicular to the direction in which the plurality of heat fins 614 extends. In some implementations, the plurality of ventilation slots 1315 may extend in a direction parallel in which the front side of the top housing 610 extends. The plurality of ventilation slots 1315 may have a rectangular pattern and may extend linearly across the face of the solar shield 1310. The plurality of ventilation slots 1315 may include multiple ventilation slots that extend along the same line. The ventilation slots above and below the multiple ventilation slots may be staggered or offset from the multiple ventilation slots extending along the same line.

Figure 14:
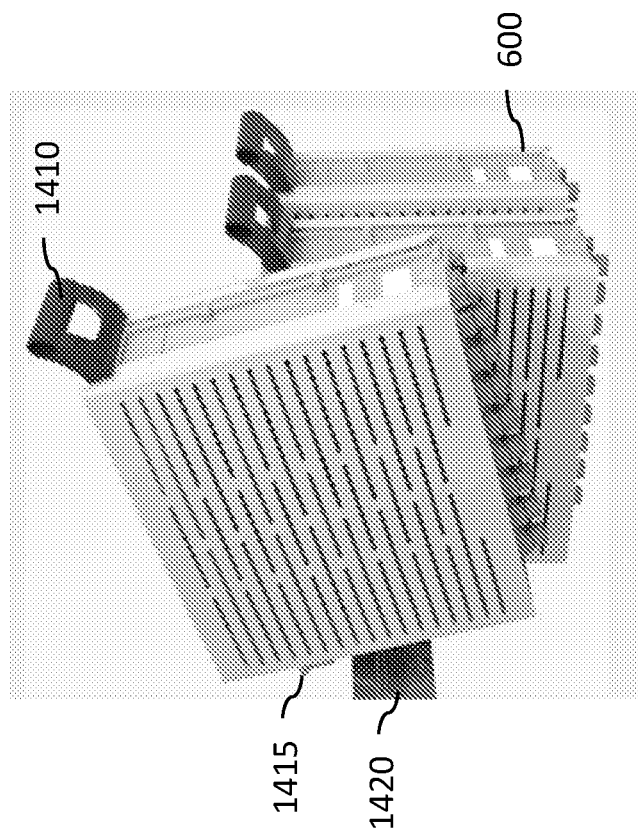
FIG. 14 is a side view of a plurality of self-cooling chassis coupled to a mounting bar, according to some implementations of the current subject matter.

FIG. 14 is a side view of a plurality of self-cooling chassis coupled to a mounting bar 1420, according to some implementations of the current subject matter. The self-cooling chassis 600 may include a handle 1410 and an overhang 1415 for coupling the self-cooling chassis to the mounting bar 1420. In some implementations, the self-cooling chassis 600 may be configured to couple to a mounting bar 1420 with the overhang 1415. The self-cooling chassis 600 may be suspended from the mounting bar 1420 using the overhang 1415 positioned at the side of the self-cooling chassis 600. The overhang 1415 may be configured to detachably couple to the mounting bar 1420 by sliding the overhang 1415 over an edge of the mounting bar 1420. In some implementations, the self-cooling chassis 600 may be configured to be removed from the mounting bar 1420 by lifting the self-cooling chassis 600. For example, the handle 1410 may be coupled to the top housing 610 or the bottom housing 630. The handle 1410 may be positioned on the opposite side of the overhang 1415 for detaching the overhang 1415 from the mounting bar 1420.

Figure 15:
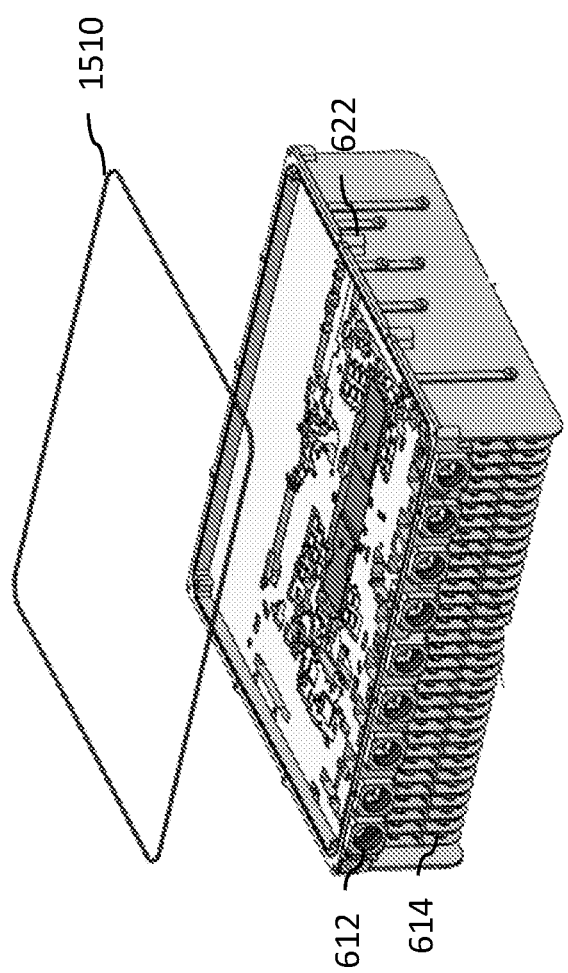
FIG. 15 is a perspective view of an O-ring positioned between the top housing and the bottom housing, according to some implementations of the current subject matter.

FIG. 15 is a perspective view of an O-ring 1510 positioned between the top housing and the bottom housing, according to some implementations of the current subject matter. The O-ring 1510 may be configured to create a seal between the top housing 610 and the bottom housing 630. The O-ring 1510 may be detachably coupled to at least one of the top housing 610 and the bottom housing 630. The O-ring 1510 may be inserted into a groove at the top housing 610 and the bottom housing 630. The groove may extend around the perimeter of the top housing 610 and the bottom housing 630 to prevent any moisture and debris from entering the self-cooling chassis 600. The compressed O-ring 1510 may qualify for IP-65 or IP-67 compliance for the self-cooling chassis 600.

Figure 16:
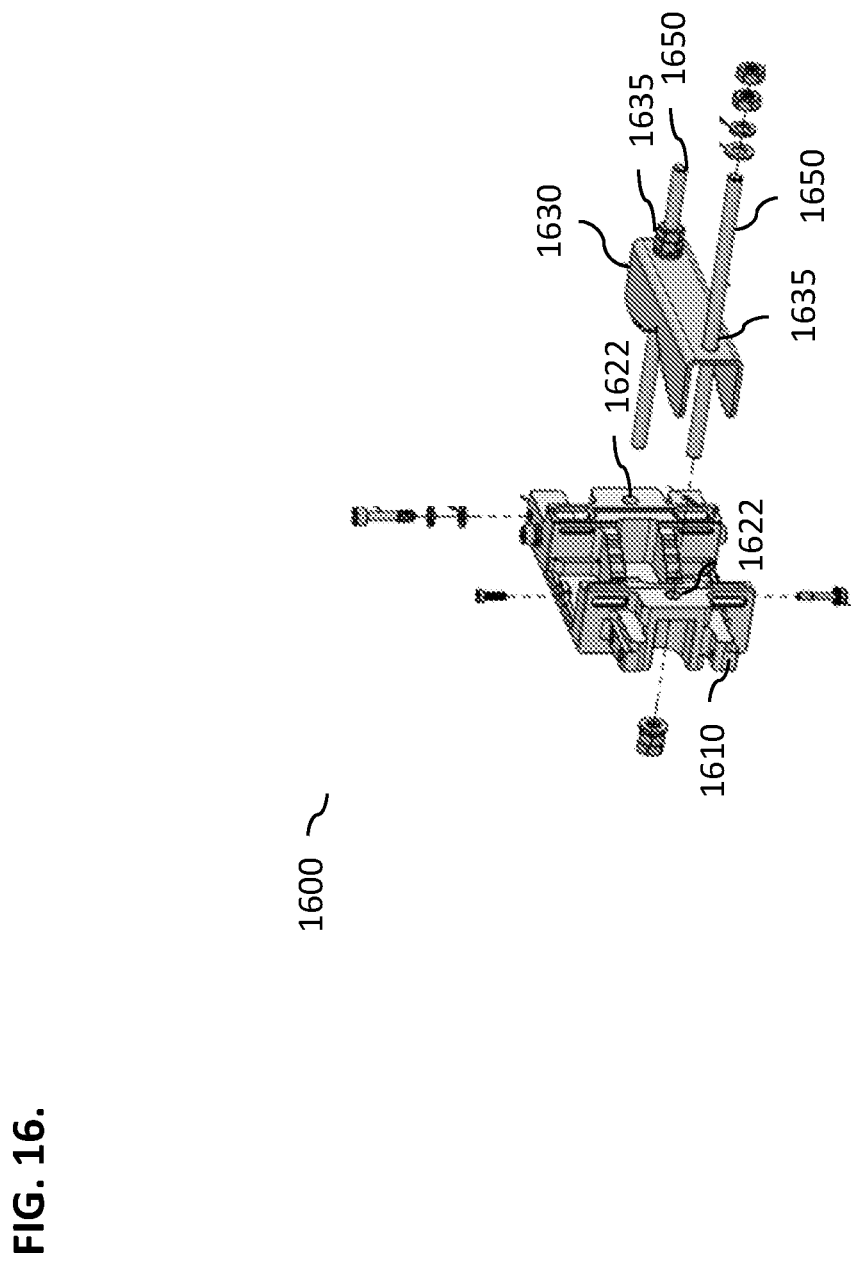
FIG. 16 is a perspective view of a mounting bracket for suspending the self-cooling chassis, according to some implementations of the current subject matter.

FIG. 16 is a perspective view of a mounting bracket 1600 for suspending the self-cooling chassis 600, according to some implementations of the current subject matter. The mounting bracket 1600 may include a housing bracket 1610 configured to couple to the self-cooling chassis 600 and a distal bracket 1630 configured to couple to the housing bracket 1610. The housing bracket 1610 and the distal bracket 1630 may apply pressure to a vertical column for securing the self-cooling chassis 600 to the vertical column.

The housing bracket 1610 may include a convex-shaped feature for receiving a proximate side of the vertical column. The convex-shaped feature may be shaped to create a pressure point against the vertical column. For example, the housing bracket 1610 may include two convex shapes to create two pressure points against the vertical column. The convex shapes may extend from the side of the housing bracket 1610 to the center of the housing bracket 1610. The two convex shapes may have a semi-circular shape. The two convex shapes may curve outward from the side of the housing bracket 1610 to contact against the vertical column. The convex-shaped feature may be positioned between the at least two housing bracket apertures. In some implementations, the convex-shaped feature may be formed from a compressible material.

The housing bracket 1610 may include two housing bracket apertures 1622. The two housing bracket apertures 1622 may be positioned to the sides of the convex-shaped feature. The two housing bracket apertures 1622 may pass through the housing bracket 1610 and may be positioned at the sides of the housing bracket 1610. The housing bracket apertures 1622 may be configured to receive the rods 1650. The rods 1650 may be configured to attach to the housing bracket 1610 with a threaded nut. The rods 1650 may be configured to couple the distal bracket 1630 to the housing bracket 1610.

The distal bracket 1630 may include a convex-shaped feature for receiving a distal side of the vertical column. The convex-shaped feature may be shaped to create a pressure point against the vertical column. For example, the distal bracket 1630 may include two convex shapes to create two pressure points against the vertical column. The convex shapes may extend from the side of the distal bracket 1630 to the center of the distal bracket 1630. The two convex shapes may have a semi-circular shape. The two convex shapes may curve outward from the side of the distal bracket 1630 to contact against the vertical column. In some implementations, the convex-shaped feature may be formed from a compressible material. In some implementations, the distal bracket 1630 may be replaced with a banding to that wraps around a pole or tree without the need for rods. The banding may couple directly to the housing bracket 1610 at the sides.

The housing bracket 1610 may include two distal bracket apertures 1635. The two distal bracket apertures 1635 may pass through the distal bracket 1630 and may be positioned at the sides of the distal bracket 1630. The distal bracket apertures 1635 may be configured to receive the rods 1650. The rods 1650 may be configured to attach to the distal bracket 1630 with a threaded nut. The rods 1650 may be configured to couple the housing bracket 1610 to the distal bracket 1630.

The rods 1650 may be threaded. A threading mechanism (e.g., a threaded nut) may be applied to the rods 1650 for moving the distal bracket 1630 closer to the housing bracket 1610. The length of the rods 1650 may be longer than the diameter or width of the vertical column.

Figure 17B:
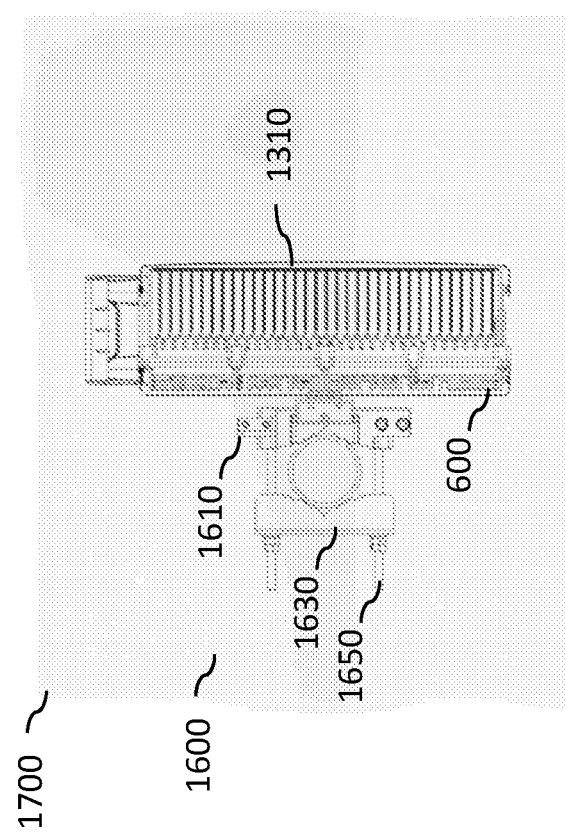
FIG. 17B is a top view of a single chassis mounting bracket configuration for suspending the self-cooling chassis, according to some implementations of the current subject matter.
Figure 17A:
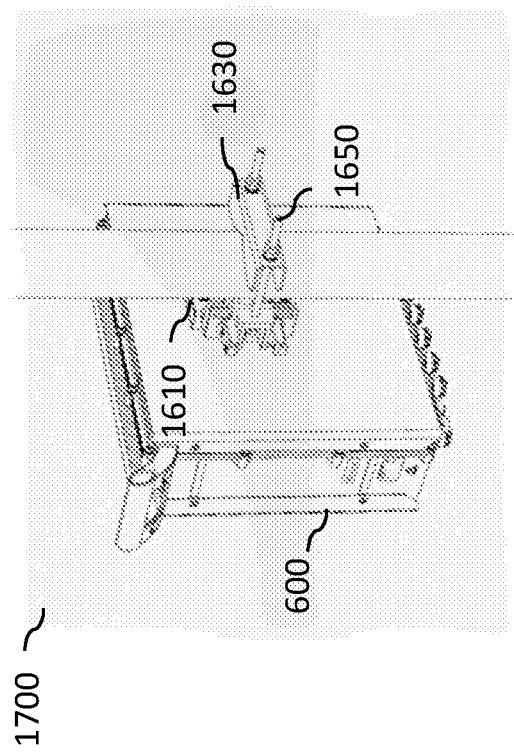
FIG. 17A is a side view of a single chassis mounting bracket configuration for suspending the self-cooling chassis, according to some implementations of the current subject matter.

FIG. 17A is a side view of a single chassis mounting bracket configuration 1700 for suspending the self-cooling chassis 600, according to some implementations of the current subject matter. The single chassis mounting bracket configuration may include the mounting bracket 1600. The housing bracket 1610 of the mounting bracket 1600 may be configured to couple to the bottom side of the bottom housing 630. In some implementations, the housing bracket 1610 of the mounting bracket 1600 may be configured to couple to the side opposite the solar shield 1310.

FIG. 17B is a top view of a single chassis mounting bracket configuration 1700 for suspending the self-cooling chassis 600, according to some implementations of the current subject matter.

Figure 18B:
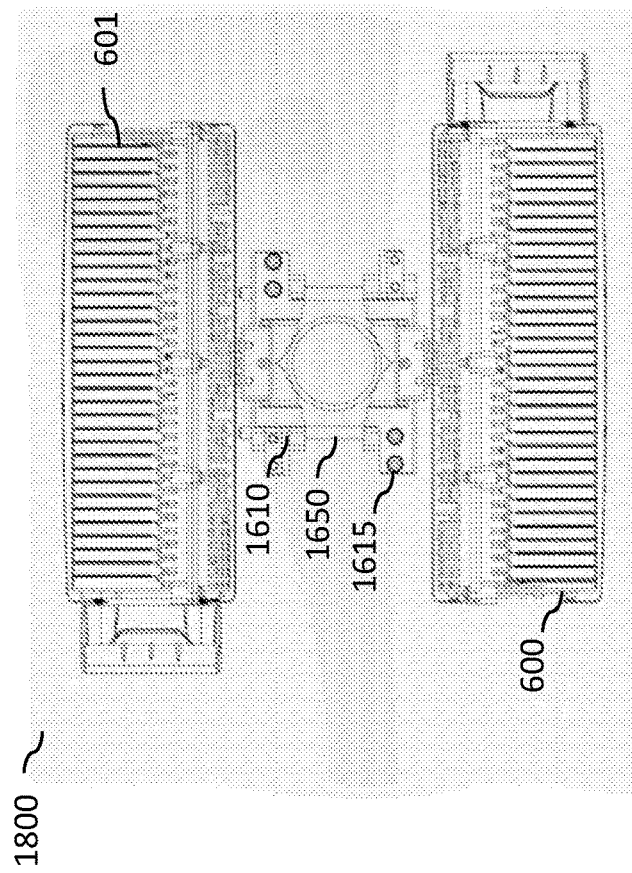
FIG. 18B is a top view of a dual chassis mounting bracket configuration 1800 for suspending two opposing self-cooling chassis, according to some implementations of the current subject matter.
Figure 18A:
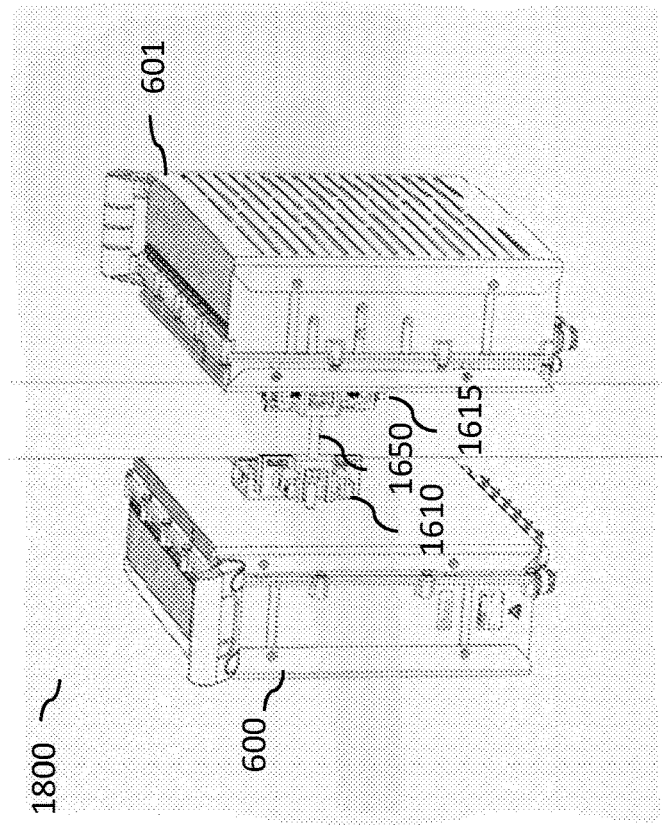
FIG. 18A is a side view of a dual chassis mounting bracket configuration for suspending two opposing self-cooling chassis, according to some implementations of the current subject matter.

FIG. 18A is a side view of a dual chassis mounting bracket configuration 1800 for suspending two opposing self-cooling chassis, according to some implementations of the current subject matter. The dual chassis mounting bracket configuration 1800 may include a housing bracket 1610 and an opposing housing bracket 1615. In some implementations, the distal bracket 1630 of the mounting bracket 1600 may be replaced with the opposing housing bracket 1615 for attaching a second self-cooling chassis 601. The housing bracket 1610 may couple to the self-cooling chassis 600 and the opposing housing bracket 1615 may couple to the second self-cooling chassis 601 on the opposite side of the housing bracket 1610.

FIG. 18B is a top view of a dual chassis mounting bracket configuration 1800 for suspending two opposing self-cooling chassis, according to some implementations of the current subject matter. The dual chassis mounting bracket configuration 1800 can be scaled to include additional side housing brackets and additional opposing housing brackets.

Figure 19B:
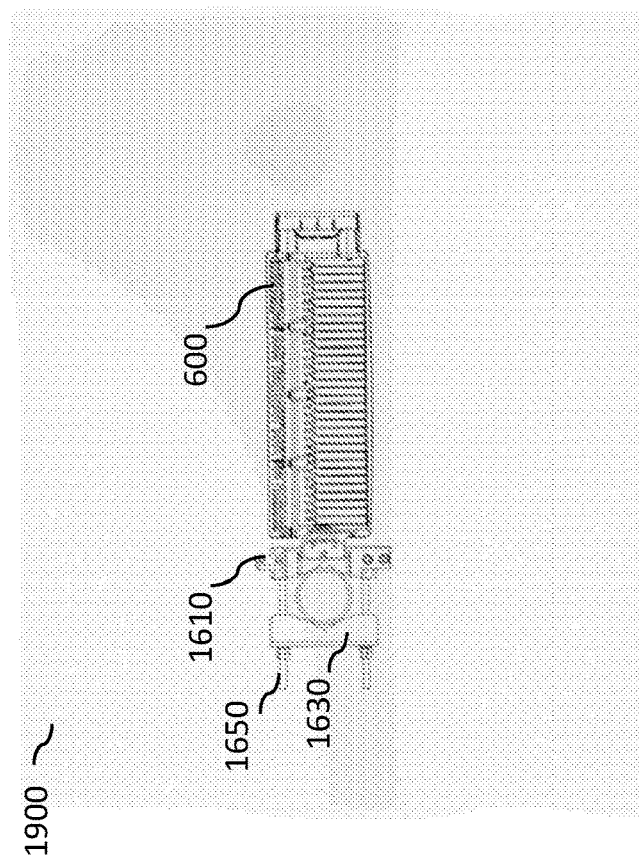
FIG. 19B is a top view of a single chassis side mounting bracket configuration 1900 for suspending the self-cooling chassis 600 at a narrow side of the self-cooling chassis 600, according to some implementations of the current subject matter.
Figure 19A:
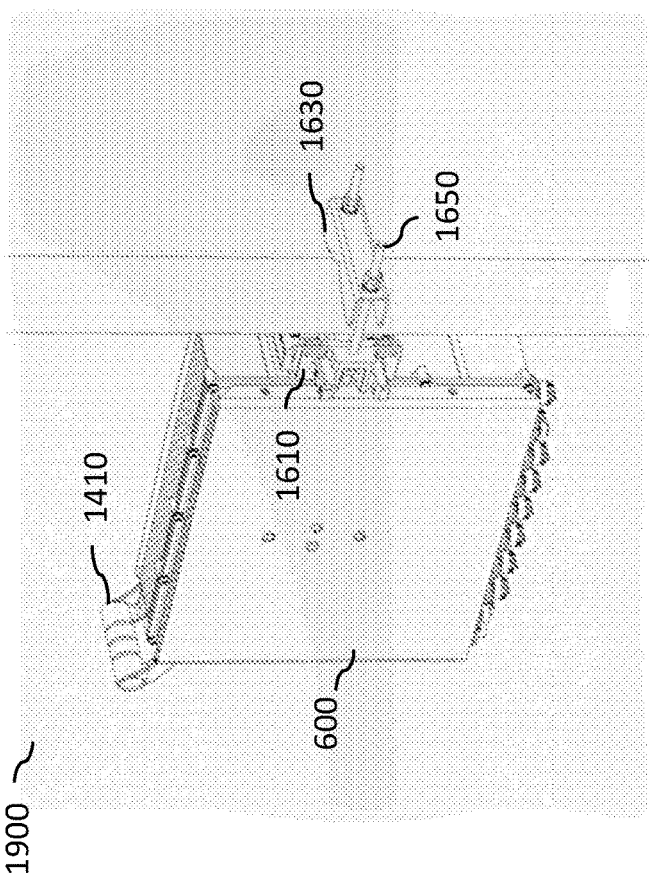
FIG. 19A is a side view of a single chassis side mounting bracket configuration for suspending the self-cooling chassis at a narrow side of the self-cooling chassis, according to some implementations of the current subject matter.

FIG. 19A is a side view of a single chassis side mounting bracket configuration 1900 for suspending the self-cooling chassis 600 at a narrow side of the self-cooling chassis 600, according to some implementations of the current subject matter. The single chassis side mounting bracket configuration 1900 may include a housing bracket 1610 configured to couple to a narrow side of the self-cooling chassis 600. In some implementations, the housing bracket 1610 of the mounting bracket 1600 may be configured to couple to the side of the self-cooling chassis opposite the handle 1410. The distal bracket 1630 may be configured to couple the housing bracket 1610 to the vertical column.

FIG. 19B is a top view of a single chassis side mounting bracket configuration 1900 for suspending the self-cooling chassis 600 at a narrow side of the self-cooling chassis 600, according to some implementations of the current subject matter. The single chassis side mounting bracket configuration 1900 can be scaled to include additional side housing brackets and additional opposing housing brackets.

Figures 20A, 20B:
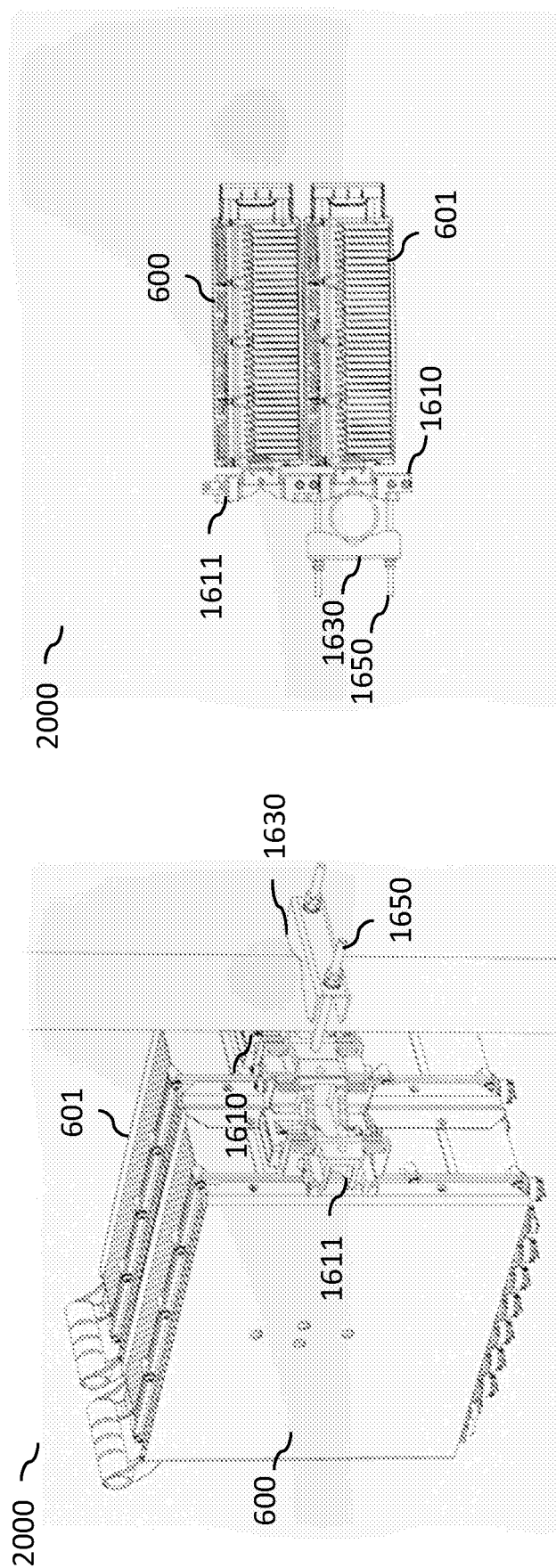
FIG. 20A is a side view of a dual chassis side mounting bracket configuration 2000 for suspending two self-cooling chassis at the narrow sides of the self-cooling chassis, according to some implementations of the current subject matter.
FIG. 20B is a top view of a dual chassis side mounting bracket configuration 2000 for suspending two self-cooling chassis at the narrow sides of the self-cooling chassis, according to some implementations of the current subject matter.

FIG. 20A is a side view of a dual chassis side mounting bracket configuration 2000 for suspending two self-cooling chassis at the narrow sides of the self-cooling chassis, according to some implementations of the current subject matter. The dual chassis side mounting bracket configuration 2000 may include the housing bracket 1610, the side housing bracket 1611, and the distal bracket 1630. In some implementations, the housing bracket 1610 may be configured to couple to a side housing bracket 1611 such that the self-cooling chassis 600 may be positioned alongside a second self-cooling chassis 601. In some implementations, the housing bracket 1610 may be configured to couple to the side housing bracket 1611 when the housing bracket 1610 and the side housing bracket 1611 are coupled to the narrow end of the self-cooling chassis 600 and the second self-cooling chassis 601, respectively. The distal bracket 1630 may be configured to couple the housing bracket 1610 and the side housing bracket 1611 to the vertical column.

FIG. 20B is a top view of a dual chassis side mounting bracket configuration 2000 for suspending two self-cooling chassis at the narrow sides of the self-cooling chassis, according to some implementations of the current subject matter. The dual chassis side mounting bracket configuration 2000 can be scaled to include additional side housing brackets and additional opposing housing brackets.

Figures 21A, 21B:
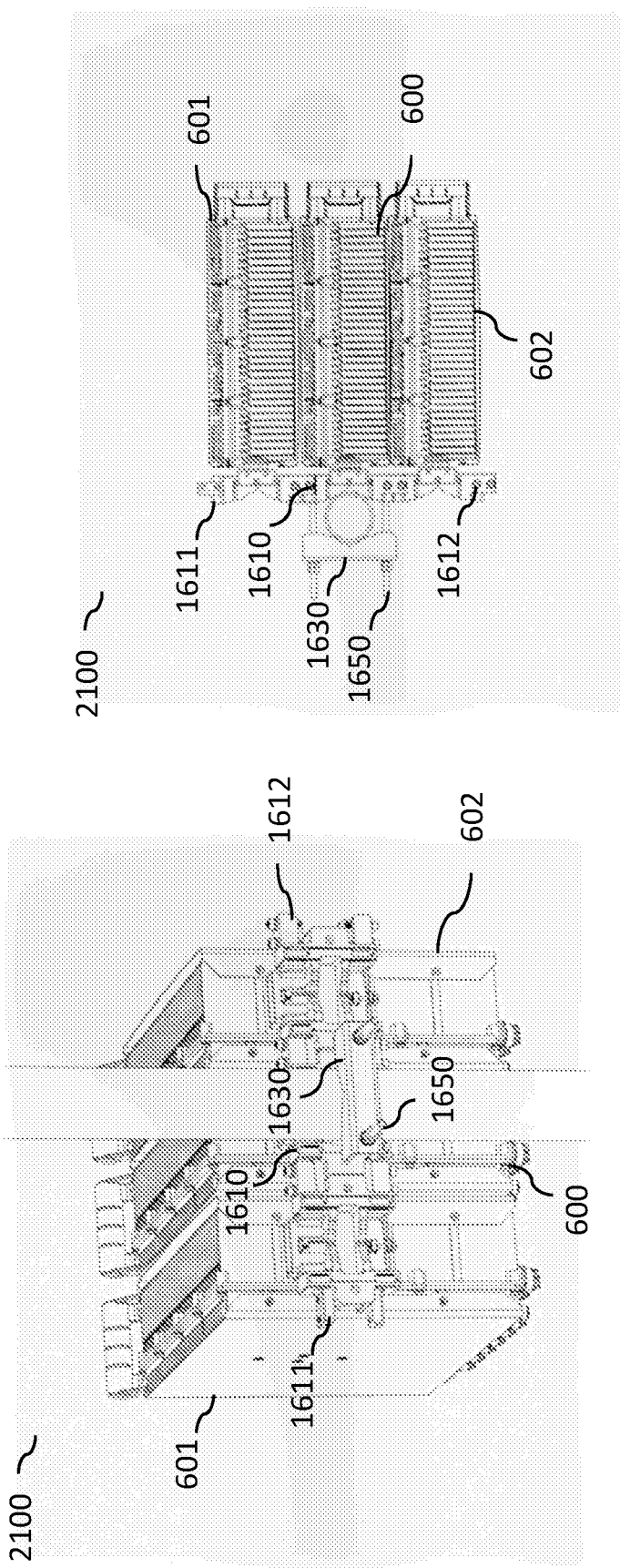
FIG. 21A is a side view of a triple chassis side mounting bracket configuration 2100 for suspending three self-cooling chassis at the narrow sides of the three self-cooling chassis, according to some implementations of the current subject matter.
FIG. 21B is a side view of a triple chassis side mounting bracket configuration 2100 for suspending three self-cooling chassis at the narrow sides of the three self-cooling chassis, according to some implementations of the current subject matter.

FIG. 21A is a side view of a triple chassis side mounting bracket configuration 2100 for suspending three self-cooling chassis at the narrow sides of the three self-cooling chassis, according to some implementations of the current subject matter. The triple chassis side mounting bracket configuration 2100 may include the housing bracket 1610, the side housing bracket 1611, the second side housing bracket 1612, and the distal bracket 1630. In some implementations, the housing bracket 1610 may be configured to couple to the side housing bracket 1611 such that the self-cooling chassis 600 may be positioned alongside the second self-cooling chassis 601. Additionally, in some implementations, the housing bracket 1610 may be configured to couple to the side housing bracket 1611 and a second side housing bracket 1612 such that the self-cooling chassis 600 may be positioned alongside the second self-cooling chassis 601 and the third self-cooling chassis 602, respectively. The housing bracket 1610, the side housing bracket 1611, and the second side housing bracket 1612 are configured to couple to the vertical column using the distal bracket 1630.

FIG. 21B is a side view of a triple chassis side mounting bracket configuration 2100 for suspending three self-cooling chassis at the narrow sides of the three self-cooling chassis, according to some implementations of the current subject matter. The triple chassis side mounting bracket configuration 2100 can be scaled to include additional side housing brackets and additional opposing housing brackets.

Figure 22B:
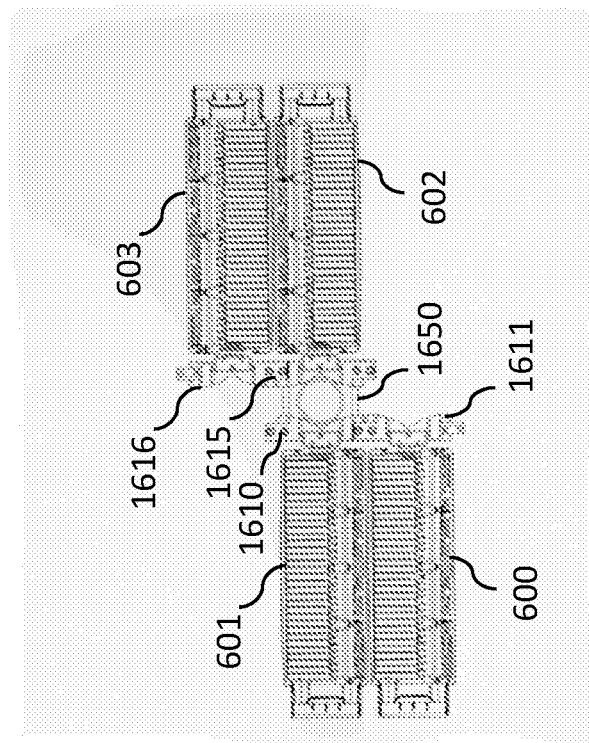
FIG. 22B is a top view of a quadruple chassis side mounting bracket configuration 2200 for suspending two sets of self-cooling chassis at the narrow sides of the self-cooling chassis, according to some implementations of the current subject matter.
Figure 22A:
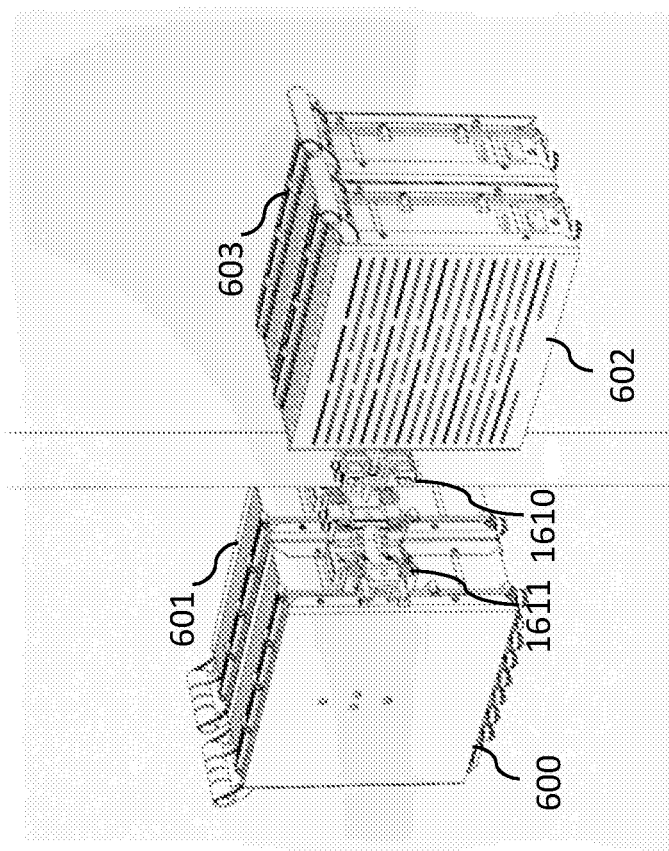
FIG. 22A is a side view of a quadruple chassis side mounting bracket configuration 2200 for suspending two sets of self-cooling chassis at the narrow sides of the self-cooling chassis, according to some implementations of the current subject matter.

FIG. 22A is a side view of a quadruple chassis side mounting bracket configuration 2200 for suspending two sets of self-cooling chassis at the narrow sides of the self-cooling chassis, according to some implementations of the current subject matter. The quadruple chassis side mounting bracket configuration 2200 includes the housing bracket 1610, the side housing bracket 1611, the opposing housing bracket 1615, and a second side opposing housing bracket 1616. In some implementations, the distal bracket 1630 of the mounting bracket 1600 may be replaced with the opposing housing bracket 1615 for attaching the third self-cooling chassis 602. The housing bracket 1610 may couple to the side housing bracket 1611 to support the self-cooling chassis 600 and the second self-cooling chassis 601. The opposing housing bracket 1615 may couple to the second side opposing housing bracket 1616. The opposing housing bracket 1615 may support the third self-cooling chassis 602 and the second side opposing housing bracket 1616 may support the fourth self-cooling chassis 603.

FIG. 22B is a top view of a quadruple chassis side mounting bracket configuration 2200 for suspending two sets of self-cooling chassis at the narrow sides of the self-cooling chassis, according to some implementations of the current subject matter. The quadruple chassis side mounting bracket configuration 2200 can be scaled to include additional side housing brackets and additional opposing housing brackets. The number of self-cooling chassis that can be mounted by a scaled bracket configuration or any bracket configuration is limitless. The only constraint limiting the number of self-cooling chassis suspended by a mounting configuration is the weight and suspension limitations of the vertical column.

Figure 23:
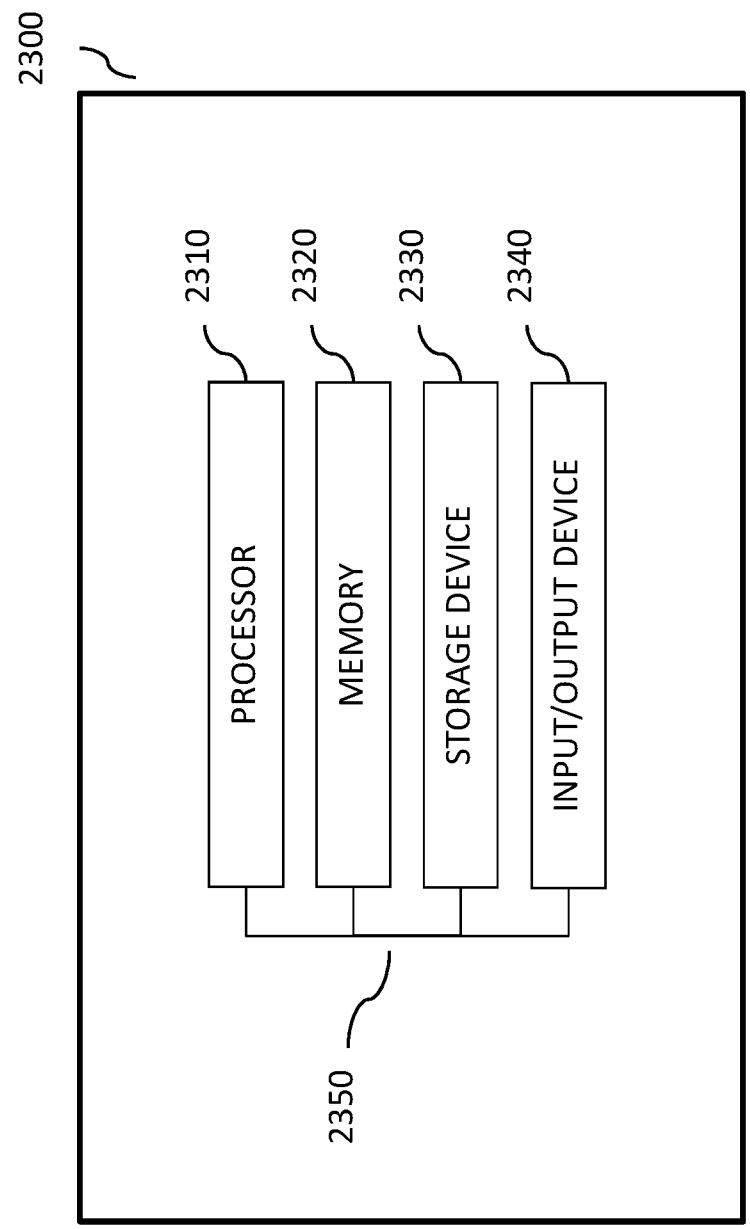
FIG. 23 illustrates an exemplary system, according to some implementations of the current subject matter.

FIG. 23 illustrates an exemplary system, according to some implementations of the current subject matter.

In some implementations, the current subject matter can be configured to be implemented in a system 2300, as shown in FIG. 23. The system 2300 can include one or more of a processor 2310, a memory 2320, a storage device 2330, and an input/output device 2340. Each of the components 2310, 2320, 2330 and 2340 can be interconnected using a system bus 2350. The at least one processor 2310 can be configured to process instructions for execution within the system. In some implementations, the at least one processor 2310 can be a single-threaded processor. In alternate implementations, the at least one processor 2310 can be a multi-threaded processor. The at least one processor 2310 can be further configured to process instructions stored in the memory 2320 or on the storage device 2330, including receiving or sending information through the input/output device 2340. The memory 2320 can store information within the system 2300. In some implementations, the memory 2320 can be a computer-readable medium. In alternate implementations, the memory 2320 can be a volatile memory unit. In yet some implementations, the memory 2320 can be a non-volatile memory unit. The storage device 2330 can be capable of providing mass storage for the system 2300. In some implementations, the storage device 2330 can be a computer-readable medium. In alternate implementations, the storage device 2330 can be a floppy disk device, a hard disk device, an optical disk device, a tape device, non-volatile solid state memory, or any other type of storage device. The input/output device 2340 can be configured to provide input/output operations for the system 2300. In some implementations, the input/output device 2340 can include a keyboard and/or pointing device. In alternate implementations, the input/output device 2340 can include a display unit for displaying graphical user interfaces.

Figure 24:
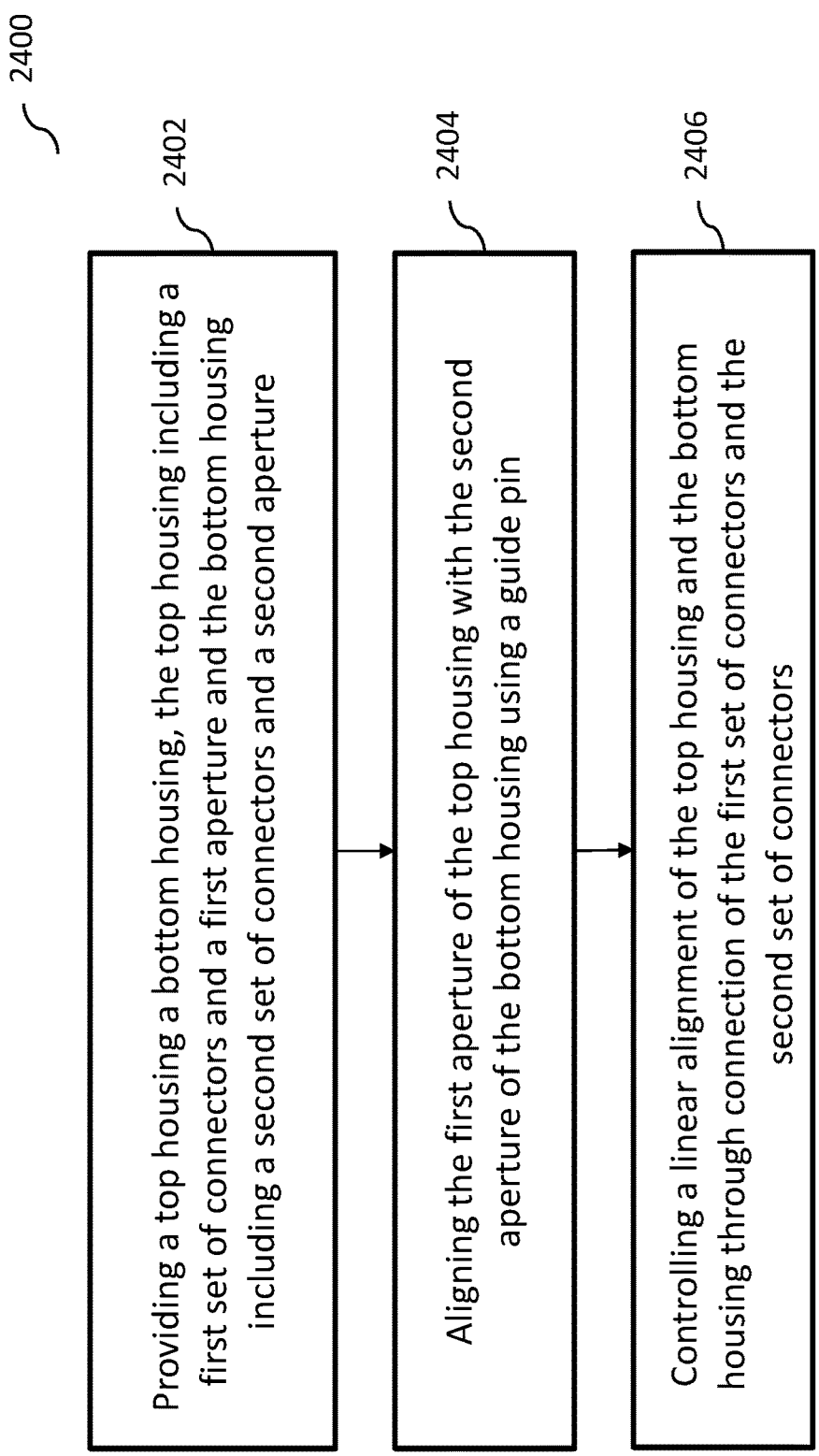
FIG. 24 illustrates an exemplary method, according to some implementations of the current subject matter.

FIG. 24 illustrates an exemplary method 1100 for assembling a self-cooling chassis 600, according to some implementations of the current subject matter. The assembly of the self-cooling chassis 600 may involve the blind coupling of the top housing 610 to the bottom housing 630. Furthermore, the assembly of the self-cooling chassis 600 may involve coupling the processing circuitry 820 with a first set of I/O connectors 612 with the I/O circuitry 636 with a second set of I/O connectors 632.

At 2402, a top housing 610 and a bottom housing 630 is provided. The top housing 610 may include a first set of I/O connectors 612 arranged along a front side of the top housing 610. The top housing 610 may be configured to house the processor 1021 communicatively coupled to the first set of I/O connectors 612. The top housing 610 may have a top side including a plurality of heat fins 614 configured to dissipate heat away from the at least one processor. The top housing 610 may include a top housing aperture 1217. The bottom housing 630 may include a second set of I/O connectors 632 arranged along a front side of the bottom housing 630. The bottom housing 630 may be configured to house an input/output (I/O) circuitry 636. The I/O circuitry 636 may be configured to communicatively couple the second set of I/O connectors 632 to the processor 1021. The bottom housing 630 may include a bottom housing aperture 1237.

At 2404, the top housing aperture 1217 of the top housing 610 may be aligned with the bottom housing aperture 1237 of the bottom housing 630 using a guide pin 1150. The aligning of the top housing 610 with the bottom housing 630 may include aligning the top housing front side with the bottom housing front side and aligning of the top housing alignment fastener 622 with the bottom housing alignment aperture 642.

At 2406, a linear alignment of the top housing 610 and the bottom housing 630 is controlled using the top housing alignment fastener 622 and the bottom housing alignment aperture 642.

In some implementations, the current subject matter can include one or more of the following optional features. In some variations, an embedded vapor chamber 625 may be coupled to the top housing 610 and the embedded vapor chamber 625 may be configured to spread heat away from the at least one processor. In some variations, a solar shield 1310 may be configured to cover the plurality of heat fins 614 and may be coupled to the top housing 610 for mitigating solar radiation absorbed by the plurality of heat fins 614. The solar shield 1310 may include a plurality of ventilation slots 1315 for allowing heat dissipation from the plurality of heat fins 614. The plurality of heat fins 614 may extend in a first direction across the top side of the top housing 610. The front side of the top housing 610 may extend in a second direction perpendicular to the first direction. The plurality of heat fins 614 may include two-phased heat fins and wherein the plurality of heat fins 614 may be configured to have a predetermined pitch extending along the top side.

In some variations, the first set of input/output (I/O) connectors 612 and the second set of I/O connectors 632 may be arranged in a linear pattern across the top housing 610 front side. The first set of I/O connectors 612 and the second set of I/O connectors 632 may be radio signal access connectors. An O-ring 1510 may be coupled to at least one of the top housing 610 and the bottom housing 630. The O-ring 1510 may be configured to create a seal between the top housing 610 and the bottom housing 630. In some variations, the overhang 1415 may be coupled to at least one of the top housing 610 or the bottom housing 630. The overhang 1415 may be configured to detachably couple to a mounting bar 1420 by sliding the overhang 1415 over an edge of the mounting bar 1420. In some variations, the handle 1410 may be coupled to at least one of the top housing 610 or the bottom housing 630. The handle 1410 may be positioned on the opposite side of at least one of the top housing 610 or the bottom housing 630 for detaching the overhang 1415 from the mounting bar 1420.

The systems and methods disclosed herein can be embodied in various forms including, for example, a data processor, such as a computer that also includes a database, digital electronic circuitry, firmware, software, or in combinations of them. Moreover, the above-noted features and other aspects and principles of the present disclosed implementations can be implemented in various environments. Such environments and related applications can be specially constructed for performing the various processes and operations according to the disclosed implementations or they can include a general-purpose computer or computing platform selectively activated or reconfigured by code to provide the necessary functionality. The processes disclosed herein are not inherently related to any particular computer, network, architecture, environment, or other apparatus, and can be implemented by a suitable combination of hardware, software, and/or firmware. For example, various general-purpose machines can be used with programs written in accordance with teachings of the disclosed implementations, or it can be more convenient to construct a specialized apparatus or system to perform the required methods and techniques.

The systems and methods disclosed herein can be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

As used herein, the term "user" can refer to any entity including a person or a computer.

Although ordinal numbers such as first, second, and the like can, in some situations, relate to an order; as used in this document ordinal numbers do not necessarily imply an order. For example, ordinal numbers can be merely used to distinguish one item from another. For example, to distinguish a first event from a second event, but need not imply any chronological ordering or a fixed reference system (such that a first event in one paragraph of the description can be different from a first event in another paragraph of the description).

The foregoing description is intended to illustrate but not to limit the scope of the invention, which is defined by the scope of the appended claims. Other implementations are within the scope of the following claims.

These computer programs, which can also be referred to programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein can be implemented on a computer having a display device, such as for example a cathode ray tube (CRT) or a liquid crystal display (LCD) monitor for displaying information to the user and a keyboard and a pointing device, such as for example a mouse or a trackball, by which the user can provide input to the computer. Other kinds of devices can be used to provide for interaction with a user as well. For example, feedback provided to the user can be any form of sensory feedback, such as for example visual feedback, auditory feedback, or tactile feedback; and input from the user can be received in any form, including, but not limited to, acoustic, speech, or tactile input.

The subject matter described herein can be implemented in a computing system that includes a back-end component, such as for example one or more data servers, or that includes a middleware component, such as for example one or more application servers, or that includes a front-end component, such as for example one or more client computers having a graphical user interface or a Web browser through which a user can interact with an implementation of the subject matter described herein, or any combination of such back-end, middleware, or front-end components. The components of the system can be interconnected by any form or medium of digital data communication, such as for example a communication network. Examples of communication networks include, but are not limited to, a local area network ("LAN"), a wide area network ("WAN"), and the Internet.

The computing system can include clients and servers. A client and server are generally, but not exclusively, remote from each other and typically interact through a communication network. The relationship of client and server arises by virtue of computer programs running on the respective computers and having a client-server relationship to each other.

The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations can be within the scope of the following claims.

What is claimed:

1. An apparatus comprising:
   a top housing including a first set of input/output (I/O) connectors arranged along a top housing front side, the top housing comprising at least one processor communicatively coupled to the first set of I/O connectors, the top housing having a top side including a plurality of heat fins configured to dissipate heat away from the at least one processor, and the top housing having a top housing aperture;
   a bottom housing including a second set of I/O connectors arranged along a bottom housing front side, the bottom housing comprising a I/O circuitry, the I/O circuitry being configured to communicatively couple the second set of I/O connectors to the at least one processor and the bottom housing having a bottom housing aperture; and
   a guide pin configured to be inserted into a top housing aperture and a bottom housing aperture;
   wherein the top housing and the bottom housing are configured to connect by aligning the top housing front side with the bottom housing front side and by aligning the guide pin into the top housing aperture and the bottom housing aperture.

2. The apparatus of claim 1, wherein the plurality of heat fins extend in a first direction across the top side of the top housing, and wherein the top housing front side extends in a second direction perpendicular to the first direction.

3. The apparatus of claim 1, wherein the plurality of heat fins include one or more two-phased heat fins and wherein the plurality of heat fins are configured to have a predetermined pitch extending along the top side.

4. The apparatus of claim 1, wherein the first set of I/O connectors are arranged in a linear pattern across the top housing front side, wherein the second set of I/O connectors are arranged in the linear pattern across the bottom housing front side, and wherein the first set of I/O connectors and the second set of I/O connectors are radio signal access connectors.

5. The apparatus of claim 1, further comprising:
   a solar shield configured to cover the plurality of heat fins on the top housing for mitigating solar radiation absorbed by the plurality of heat fins, the solar shield including a plurality of ventilation slots for allowing heat dissipation from the plurality of heat fins.

6. The apparatus of claim 1, further comprising:
   a lip coupled to at least one from among the top housing and the bottom housing, the lip configured to detachably couple to a mounting bar by sliding the lip over an edge of the mounting bar; and
   a handle coupled to at least one from among the top housing and the bottom housing, the handle positioned on the opposite side of at least one from among the top housing and the bottom housing for detaching the lip from the mounting bar.

7. The apparatus of claim 1, wherein the top housing and the bottom housing are configured to fasten and align together an alignment fastener coupled to the at least one from among the top housing and the bottom housing,
   wherein the alignment fastener is configured to control a final linear alignment of the top housing and the bottom housing.

8. The apparatus of claim 1, further comprising:
an embedded vapor chamber within and coupled to the top housing, the embedded vapor chamber configured to spread heat away from the processor; and
an O-ring detachably coupled to at least one from among the top housing and the bottom housing, the O-ring configured to create a seal between the top housing and the bottom housing, the seal being IP-65 compliant.

9. The apparatus of claim 1, wherein the at least one of the at least one processor and the I/O circuitry are included in a base station that includes at least one of: a gNodeB base station, an eNodeB base station, and any combination thereof.

10. The apparatus of claim 9, wherein the base station includes at least one of: one or more distributed units, one or more baseband units, one or more radio interface units, one or more remote radio heads, and any combination thereof.

11. The apparatus of claim 8, wherein the base station is a base station operating in at least one of the following communications systems: a long term evolution communications system and a new radio communications system.

12. A method for assembling an apparatus, the method comprising:
providing a top housing and a bottom housing, the top housing including a first set of input/output (I/O) connectors arranged along a top housing front side, the top housing comprising at least one processor communicatively coupled to the first set of I/O connectors, the top housing having a top side including a plurality of heat fins configured to dissipate heat away from the at least one processor, the top housing including a first aperture, the bottom housing including a second set of I/O connectors arranged along a bottom housing front side, the bottom housing comprising an I/O circuitry, the I/O circuitry configured to communicatively couple the second set of I/O connectors to the processor, the bottom housing including a second aperture;
aligning the first aperture of the top housing with the second aperture of the bottom housing using a guide pin, the aligning of the top housing with the bottom housing includes aligning the top housing front side with the bottom housing front side and aligning of the top housing alignment fastener with the bottom housing alignment aperture; and
controlling a linear alignment of the top housing and the bottom housing through connection of the top housing alignment fastener and the bottom housing alignment aperture.

13. The method of claim 12, wherein an embedded vapor chamber is coupled to the top housing, the embedded vapor chamber configured to spread heat away from the processor.

14. The method of claim 13, wherein a solar shield, configured to cover the plurality of heat fins, is coupled to the top housing for mitigating solar radiation absorbed by the plurality of heat fins, the solar shield including a plurality of ventilation slots for allowing heat dissipation from the plurality of heat fins.

15. The method of claim 12, wherein the plurality of heat fins extends in a first direction across the top side of the top housing, and wherein the top housing front side extends in a second direction perpendicular to the first direction.

16. The method of claim 12, wherein the plurality of heat fins include two-phased heat fins and wherein the plurality of heat fins are configured to have a predetermined pitch extending along the top side.

17. The method of claim 12, wherein the first set of I/O connectors are arranged in a linear pattern across the top housing front side, wherein the second set of I/O connectors are arranged in the linear pattern across the bottom housing front side, and wherein the first set of I/O connectors and the second set of I/O connectors are radio signal access connectors.

18. The method of claim 12, wherein an O-ring is coupled to at least one from among the top housing and the bottom housing, the O-ring configured to create a seal between the top housing and the bottom housing.

19. The method of claim 12, wherein a lip is coupled to at least one from among the top housing and the bottom housing, the lip configured to detachably couple to a mounting bar by sliding the lip over an edge of the mounting bar; and
a handle is coupled to at least one from among the top housing and the bottom housing, the handle positioned on the opposite side of at least one from among the top housing and the bottom housing for detaching the lip from the mounting bar.

20. An apparatus comprising:
a top housing including a first set of input/output (I/O) connectors arranged along a top housing front side, the top housing configured to house at least one processor communicatively coupled to the first set of I/O connectors, the top housing having a top side including a plurality of heat fins configured to dissipate heat away from the at least one processor, and the top housing having a top housing aperture;
a bottom housing including a second set of I/O connectors arranged along a bottom housing front side, the bottom housing configured to house a I/O circuitry, the I/O circuitry being configured to communicatively couple the second set of I/O connectors to the at least one processor and the bottom housing having a bottom housing aperture;
a guide pin configured to be inserted into a top housing aperture and a bottom housing aperture; and
a lip coupled to at least one from among the top housing and the bottom housing, the lip configured to detachably couple to a mounting bar by sliding the lip over an edge of the mounting bar,
wherein the top housing and the bottom housing are configured to connect by aligning the top housing front side with the bottom housing front side and by aligning the guide pin into the top housing aperture and the bottom housing aperture.

21. The apparatus of claim 20, further comprising a handle coupled to at least one from among the top housing and the bottom housing, the handle positioned on the opposite side of at least one from among the top housing and the bottom housing for detaching the lip from the mounting bar.

* * * * *